United States Patent
Reich et al.

(10) Patent No.: US 12,166,139 B2
(45) Date of Patent: Dec. 10, 2024

(54) SOLAR CELL WITH WRAPAROUND FINGER

(71) Applicant: SunPower Corporation, San Jose, CA (US)

(72) Inventors: Matthieu Minault Reich, San Jose, CA (US); Lewis C. Abra, San Francisco, CA (US); David Fredric Joel Kavulak, Fremont, CA (US); Andrea R. Bowring, Mountain View, CA (US); Benjamin Francois, San Jose, CA (US); Peter J. Cousins, Los Altos, CA (US); Boris Bastien, Monte Sereno, CA (US); Benjamin I. Hsia, Fremont, CA (US); Raphael M. Manalo, San Jose, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 16/585,919

(22) Filed: Sep. 27, 2019

(65) Prior Publication Data

US 2020/0105951 A1  Apr. 2, 2020

Related U.S. Application Data

(60) Provisional application No. 62/739,064, filed on Sep. 28, 2018.

(51) Int. Cl.
*H01L 31/044* (2014.01)
*H01L 31/02* (2006.01)
(Continued)

(52) U.S. Cl.
CPC ........ *H01L 31/022458* (2013.01); *H01L 31/02008* (2013.01); *H01L 31/0508* (2013.01); *H01L 31/18* (2013.01)

(58) Field of Classification Search
CPC ............... H01L 31/00–078; Y02E 10/50–60
(Continued)

(56) References Cited

U.S. PATENT DOCUMENTS

| 4,478,879 A | 10/1984 | Baraona et al. |
| 4,927,770 A | 5/1990 | Swanson |

(Continued)

FOREIGN PATENT DOCUMENTS

| CN | 101689554 A | 3/2010 |
| CN | 103718306 A | 4/2014 |

(Continued)

OTHER PUBLICATIONS

DE102008040332 English translation (Year: 2010).*

(Continued)

*Primary Examiner* — Bach T Dinh
(74) *Attorney, Agent, or Firm* — Schwabe, Williamson & Wyatt, P.C.

(57) ABSTRACT

A solar cell can include a first plurality of metal contact fingers, and a second plurality of metal contact fingers interdigitated with the first plurality of metal contact fingers, wherein at least one of the first plurality of metal contact fingers comprises a wrap-around metal finger that passes between a first edge of the solar cell and at least one contact pads. A photovoltaic (PV) string including a solar cell with a wrap-around metal contact finger. A method of coupling an electrically conductive connector to a solar cell with a wrap-around metal contact finger.

13 Claims, 19 Drawing Sheets

(51) Int. Cl.
  *H01L 31/0224* (2006.01)
  *H01L 31/05* (2014.01)
  *H01L 31/18* (2006.01)

(58) Field of Classification Search
  USPC .................................................. 136/243–265
  See application file for complete search history.

(56) References Cited

U.S. PATENT DOCUMENTS

| | | | |
|---|---|---|---|
| 4,933,022 A | 6/1990 | Swanson | |
| 5,053,083 A | 10/1991 | Sinton | |
| 7,804,022 B2 | 9/2010 | De Ceuster | |
| 8,766,090 B2 | 7/2014 | Sewell et al. | |
| 9,306,085 B2 | 4/2016 | Westerberg et al. | |
| 2005/0268959 A1* | 12/2005 | Aschenbrenner ... | H01L 31/0516 136/244 |
| 2006/0060238 A1 | 3/2006 | Hacke et al. | |
| 2008/0096297 A1 | 4/2008 | Schiaffino et al. | |
| 2008/0128268 A1 | 6/2008 | Lopatin et al. | |
| 2008/0216887 A1 | 9/2008 | Hacke et al. | |
| 2008/0223437 A1* | 9/2008 | De Ceuster ..... | H01L 31/022433 136/256 |
| 2008/0236655 A1 | 10/2008 | Baldwin et al. | |
| 2010/0154876 A1* | 6/2010 | Camalleri ............ | H01L 31/182 136/255 |
| 2014/0053888 A1* | 2/2014 | Westerberg ......... | H01L 31/0516 136/244 |
| 2014/0166102 A1 | 6/2014 | Bende | |
| 2015/0068592 A1 | 3/2015 | Kommera et al. | |
| 2016/0254400 A1 | 9/2016 | Westerberg et al. | |

FOREIGN PATENT DOCUMENTS

| | | | |
|---|---|---|---|
| CN | 103985772 | * | 8/2014 |
| CN | 104641472 A | | 5/2015 |
| DE | 102008040332 | * | 1/2010 |
| DE | 112012/006841 T5 | | 6/2015 |
| KR | 10-1110951 | | 2/2012 |
| WO | WO2011067338 | * | 6/2011 |

OTHER PUBLICATIONS

International Search Report and Written Opinion from Application No. PCT/US2019/053621 dated Jan. 14, 2020, 12 pgs.
International Preliminary Report on Patentability from Application No. PCT/US2019/053621 dated Apr. 8, 2021, 9 pgs.
Office Action from German Application No. 11 2019 004 856.2 dated Feb. 25, 2022, 18 pgs.
Office Action from Chinese Patent Application No. 201980059192.4 dated Oct. 25, 2023, 8 pgs.

* cited by examiner

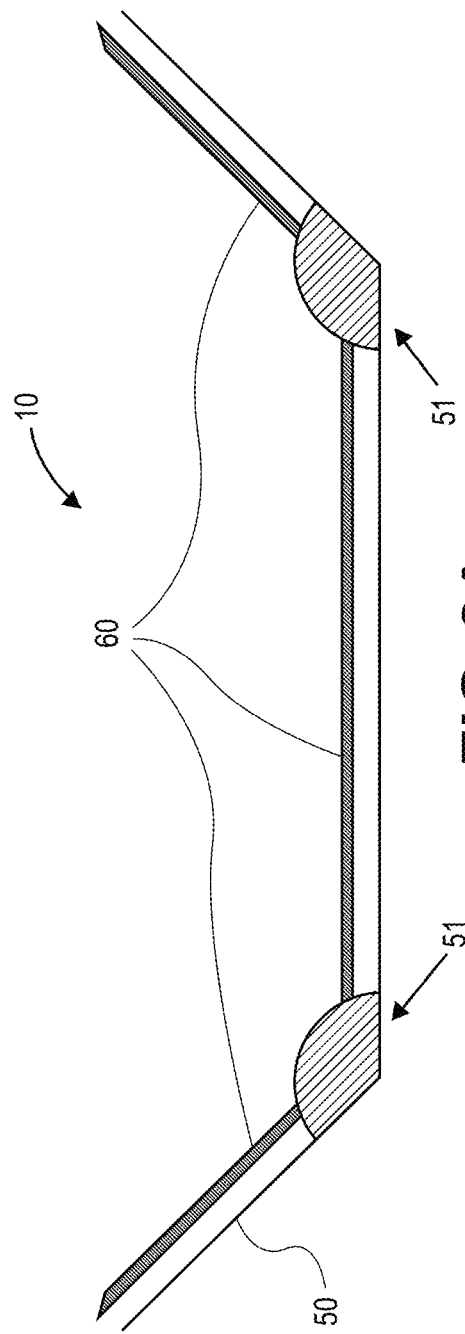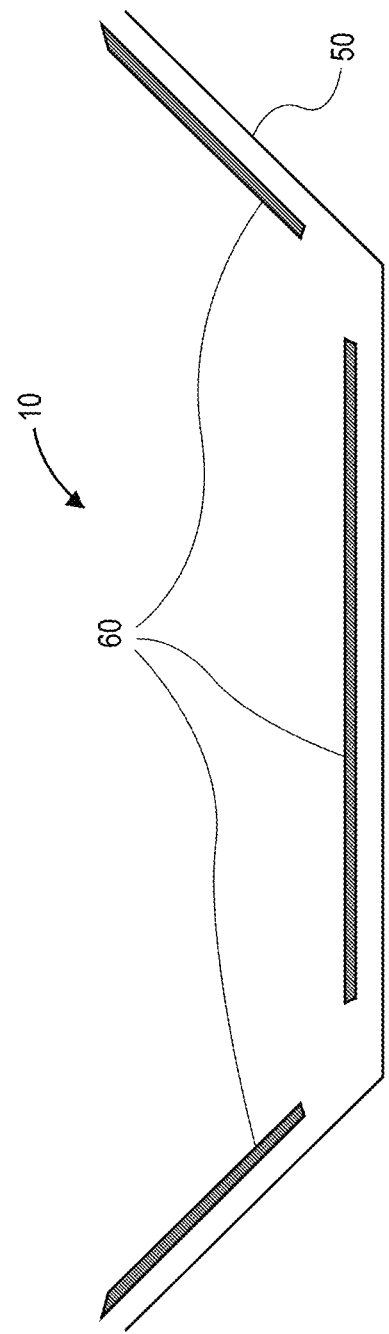

SOLAR CELL WITH WRAPAROUND FINGER

CROSS-REFERENCE TO RELATED APPLICATIONS

This application claims the benefit of U.S. Provisional Application No. 62/739,064, filed on Sep. 28, 2018, the entire contents of which are hereby incorporated by reference herein.

TECHNICAL FIELD

This disclosure relates generally to the field of solar cells, such as photovoltaic (PV) cells. In particular, this disclosure relates to solar cells having a wrap-around metal finger.

BACKGROUND

Photovoltaic (PV) cells, commonly known as solar cells, are well known devices for converting solar radiation into electrical energy. Generally, solar cells are fabricated on a semiconductor wafer or substrate using semiconductor processing techniques to form a p-n junction near a surface of the substrate. Solar radiation impinging on the surface of the substrate creates electron and hole pairs in the bulk of the substrate, which migrate to p-doped and n-doped regions in the substrate, thereby generating a voltage differential between the doped regions. The doped regions are coupled to metal contacts on the solar cell to direct an electrical current from the cell to an external circuit coupled thereto.

Electrical conversion efficiency is an important characteristic of a solar cell as it is directly related to the capability of the solar cell to generate power; with higher efficiency providing additional value to the end customer; and, with all other things equal, higher efficiency also reduces manufacturing cost per Watt. Likewise, simplified manufacturing approaches provide an opportunity to lower manufacturing costs by reducing the cost per unit produced. Accordingly, techniques for increasing the efficiency of solar cells and techniques for simplifying the manufacturing of solar cells are generally desirable.

BRIEF DESCRIPTION OF THE DRAWINGS

Embodiments will be readily understood by the following detailed description in conjunction with the accompanying drawings and the appended claims. Embodiments are illustrated by way of example and not by way of limitation in the figures of the accompanying drawings.

FIG. 8A is a schematic representation of corners of a solar cell having a wrap-around metal finger showing the position of blobs of a coating material impinging on the wrap-around metal contact finger.

FIG. 8B is a schematic representation of corners of a solar cell having a wrap-around metal finger showing the discontinuity in the wrap-around metal finger as a result of the blobs of a coating material impinging on the wrap-around p-metal contact finger.

DETAILED DESCRIPTION OF DISCLOSED EMBODIMENTS

Figure 1:
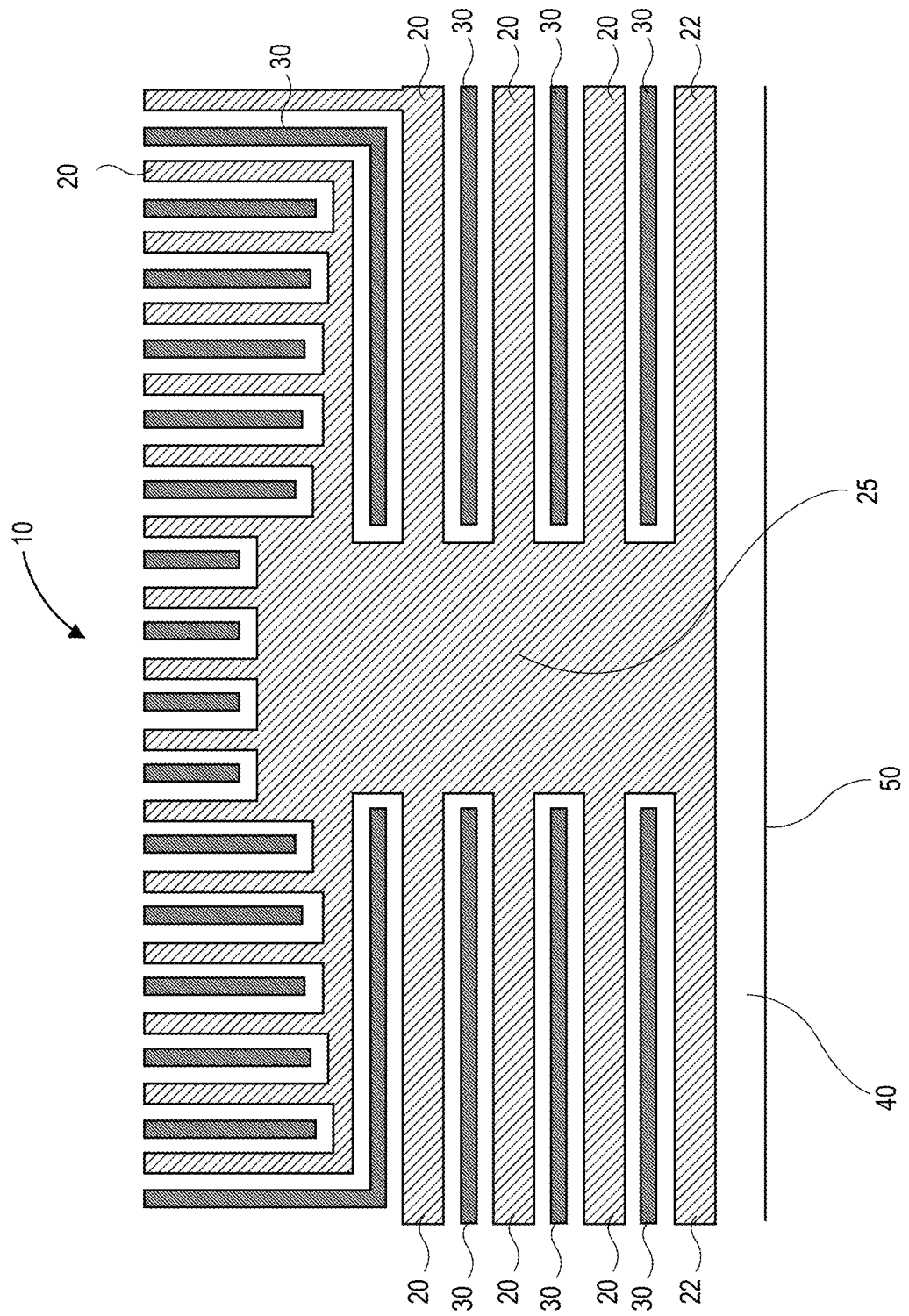
FIG. 1 is a schematic representation of an edge portion of an example solar cell.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

References to "one embodiment" or "an embodiment" do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Regions" or "portions" describe discrete areas, volumes, divisions or locations of an object or material having definable characteristics but not always fixed boundaries.

"Comprising" is an open-ended term that does not foreclose additional structure or steps.

"Configured to" connotes structure by indicating a device, such as a unit or a component, includes structure that performs a task or tasks during operation, and such structure is configured to perform the task even when the device is not currently operational (e.g., is not on/active). A device "configured to" perform one or more tasks is expressly intended to not invoke a means or step plus function interpretation under 35 U.S.C. § 112, (f) or sixth paragraph.

"First," "second," etc. terms are used as labels for nouns that they precede, and do not imply any type of ordering (e.g., spatial, temporal, logical, etc.). For example, reference to a "first" solar cell does not necessarily mean such solar cell is the first solar cell in a sequence; instead the term "first" is used to differentiate this solar cell from another solar cell (e.g., a "second" solar cell).

"Coupled" refers to elements, features, structures or nodes, unless expressly stated otherwise, that are or can be directly or indirectly joined or in communication with another element/node/feature, and not necessarily directly mechanically joined together.

"Inhibit" describes reducing, lessening, minimizing or effectively or actually eliminating something, such as completely preventing a result, outcome or future state completely.

"Doped regions," "semiconductor regions," and similar terms describe regions of a semiconductor disposed in, on, above or over a substrate. Such regions can have a N-type conductivity or a P-type conductivity, and doping concentrations can vary. Such regions can refer to a plurality of regions, such as first doped regions, second doped regions, first semiconductor regions, second semiconductor regions, etc. The regions can be formed of a polycrystalline silicon on a substrate or as portions of the substrate itself.

"Substrate" can refer to, but is not limited to, semiconductor substrates, such as silicon, and specifically such as single crystalline silicon substrates, multi-crystalline silicon substrates, wafers, silicon wafers and other semiconductor substrates used for solar cells. In an example, such substrates can be used in micro-electronic devices, photovoltaic cells or solar cells, diodes, photo-diodes, printed circuit boards, and other devices. These terms are used interchangeably herein.

In addition, certain terminology can also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology can include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure can be practiced without these specific details. In other instances, well-known techniques are not described in detail in order to not unnecessarily obscure embodiments of the present disclosure.

The approaches described herein can be applicable for interdigitated back contact (IBC) solar cells as well as other types of solar cells. The approaches described herein can be applicable to a continuous emitter back contact solar, back contact solar cell and/or a front contact solar cell. In an example, approaches described herein can be applicable to back contact solar cells where the n-type and p-type doped polysilicon regions are separated. In an example, approaches described herein can be applicable to Heterojunction with Intrinsic Thin layer (HIT) Solar cells, Tunnel Oxide Passivated Contact (TOPCon) Solar Cells, organic and front-contact solar cells, front contact cells having overlapping cell sections, Passivated Emitter and Rear Cell (PERC) solar cells, mono-PERC solar cells, Passivated Emitter with Rear Locally-Diffused (PERL) cells, 3 or 4 terminal tandem cells, and other types of solar. The approaches described herein can be applicable for solar cells having a plurality of subcells coupled by metallization structures. In an embodiment, a groove can be located between adjacent sub-cells and a metallization structure can connect the adjacent sub-cells together. In an embodiment, the groove can singulate and physically separate one sub-cell from another, e.g., adjacent, sub-cell. In an embodiment, the metallization structure can physically and electrically connect the sub-cells, where the metallization structure can be located over the groove. The approaches described herein are applicable to solar cells of various shapes and/or sizes, such as square or rectangular cells having sharp, e.g. approximately 90 degrees, or chamfered, e.g. approximately 90 degree corners with an approximately 45 degree chamfer, round corners and the like. Other shapes include round, ovoid, polygon, and the like.

FIG. 1 shows a bottom edge portion of the backside of an example solar cell 10. As shown in FIG. 1 the solar cell includes first plurality of metal contact fingers 20 and a second plurality of metal contact fingers 30 that are substantially interdigitated. In an example, the first plurality of metal contact fingers 20 can be n-metal contact fingers and the second plurality of metal contact fingers 30 can be p-metal contact fingers. Alternatively, the first plurality of metal contact fingers 20 can be p-metal contact fingers and the second plurality of metal contact fingers 30 can be n-metal contact fingers. Also shown in this view is one of a plurality of, such as at least one, contact pads 25 that can be used to connect one solar cell 10 to another solar cell, for example in series with an interconnect (not shown in this view). When multiple contact pads are used they are typically along an edge (e.g. top edge, bottom edge, positive edge and/or negative edge of a solar cell). In the view shown, the contact pad 25 can be an n-doped region (which can be referred to herein as an n-pad) and is conductively coupled to the n-metal contact fingers 20. As shown in FIG. 1, on the bottom end or negative end of the conventional solar cell 10 the finger closest to edge 50 of the solar cell 10 can be an n-metal contact finger 22. The n-metal contact finger 22 is separated from edge 50 by a non-metalized region 40. On the opposite end of the solar cell 10 (not shown in this view) the solar cell includes p-doped contact pads that are conductively coupled to the p-metal contact fingers 30. In an embodiment, the contact pad can also be referred to as a solder pad (e.g., contact pad and solder pad, as used herein, can be used interchangeably). In an example, the distance between an n-pad edge 50 to a closest p-metal finger 22 can be greater than or equal to approximately 0.3 mm to avoid shorting between the solar cell grid and an interconnect.

The amount of current that can be collected from an interdigitated back contact solar cell can be affected by the patterning of metal at the back side of the solar cell. For example, the contact pad size, finger pitch, busbar width, metal edge exclusion, and edge to metal finger distance can all have an effect on current loss and can all be dictated by the metal patterning at the back side. In one example, a solar cell can have a first polarity of contact pads (e.g., positive polarity or p-metal contact pad) on a first edge and a second polarity (e.g., negative polarity or n-metal contact pad) on a second, opposite, edge of the solar cell. Depending on the type of substrate of the solar cell, e.g., an n-type or p-type silicon substrate, the distance of one edge, located adjacent to an n-metal or p-metal contact pad, to an opposite polarity contact finger, a p-metal or n-metal finger, can affect the current loss of the solar cell.

For example, for a solar cell having an n-type silicon substrate, typically, to maximize the current output of the solar cell, it would be desirable to construct the solar cell so that the finger closest to the edge adjacent to the n-type contact pads is p-type, i.e. a p-metal contact finger. In one such example, on three edges of the solar cell, the edge to p-metal distance can be decreased enough such that it causes no additional current loss. Thus, for a solar cell having an n-type silicon substrate, there is significant potential to increase the current collection at the edges of a solar cell at the n-pad side by forming a p-metal finger close to the n-pad edge. Similarly, in another example, for a solar cell having an p-type silicon substrate, to maximize the current output of the solar cell, it would be desirable to construct the solar cell so that the finger closest to the edge adjacent to the p-type contact pads is n-type, i.e. a n-metal contact finger.

As disclosed herein, a solar cell that can maximize the amount of current that can be collected from an edge of the solar cell by placing a p-finger along all four edges of the solar cell is presented. For example, placing a wrap-around p-metal contact finger close to the n-pad edge can result in substantial gain in overall efficiency, e.g. the solar cell efficiency can increase between approximately 0.05% and 0.25%. However, placement of a p-finger against the n-pad edge could cause shorting when the interconnect is soldered to the solar cell (see FIG. 2A). To overcome the problem of shorting, an interconnect having an electrically insulating material placed between the p-metal contact finger and the n-side of the interconnect (see FIGS. 3A, 3B, 4, 5 and 6) is presented. As discussed above, although embodiments used herein can include placing a p-finger along the edges of the solar cell (e.g., for a n-type silicon substrate), other embodiments can include placing a n-finger along the edges of the solar cell (e.g., for an p-type silicon substrate). Thus, it is contemplated that the configuration as described below can be reversed, for example by swapping n-metal for p-metal and vice versa. A disclosed solar cell can include a wrap-around metal contact finger that passes between a first edge of the first solar cell and at least one first contact pad of the first solar cell, wherein the first contact pad is of opposite polarity to the wrap-around metal contact finger.

Figure 2A:
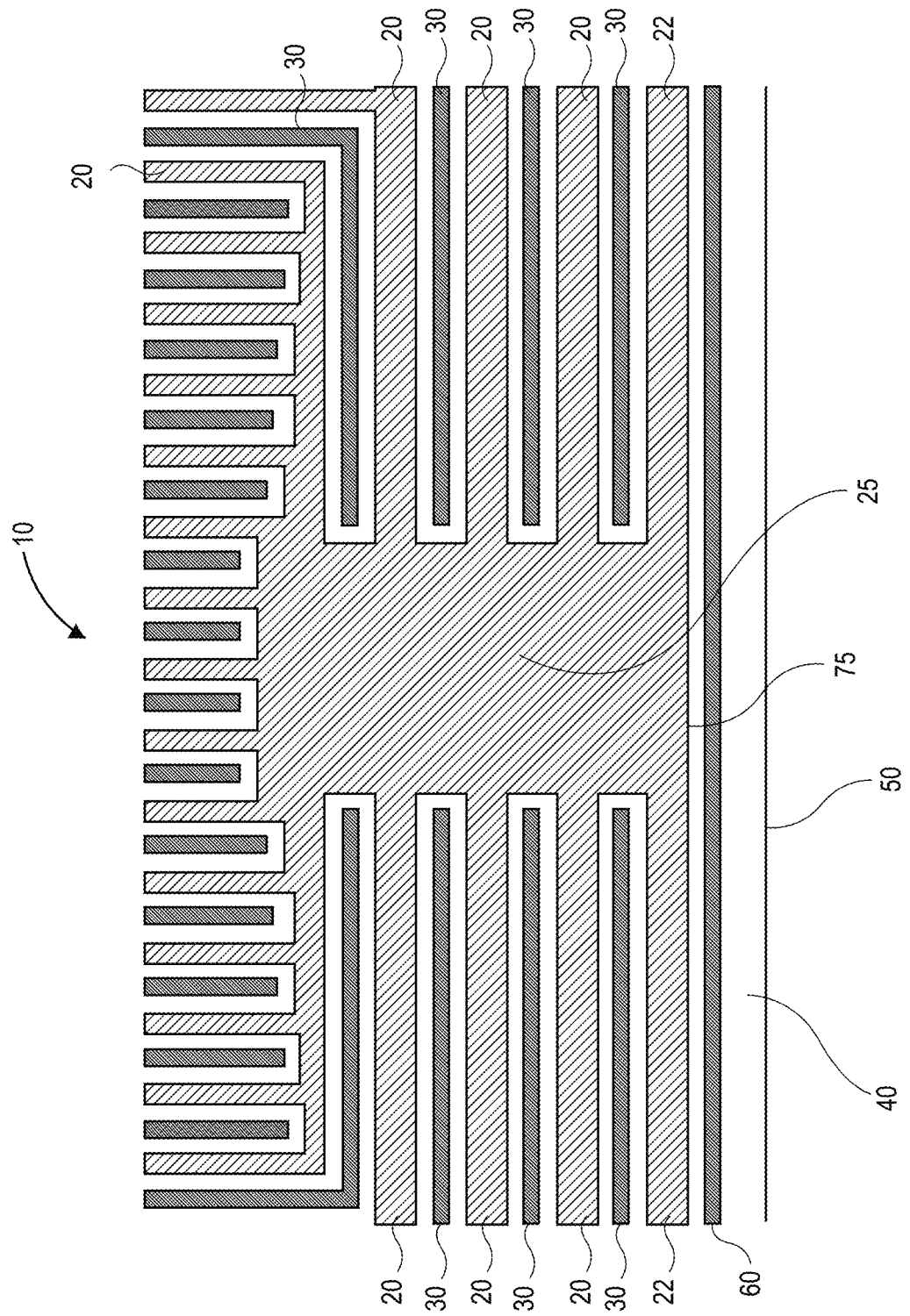
FIGS. 2A-2C are a schematic representations of another edge portion of a solar cell having a wrap-around metal finger.
Figure 2B:
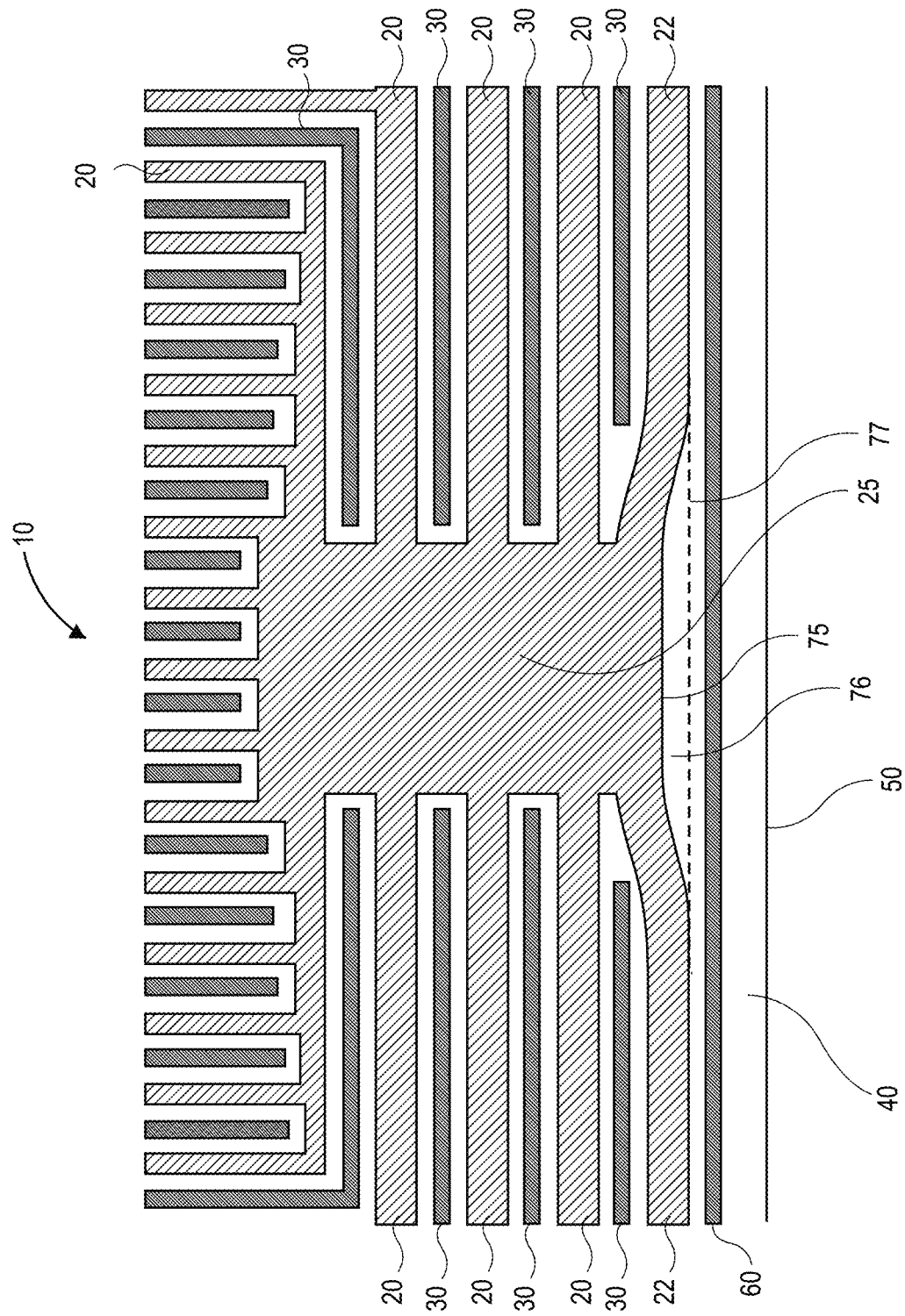
Figure 2C:
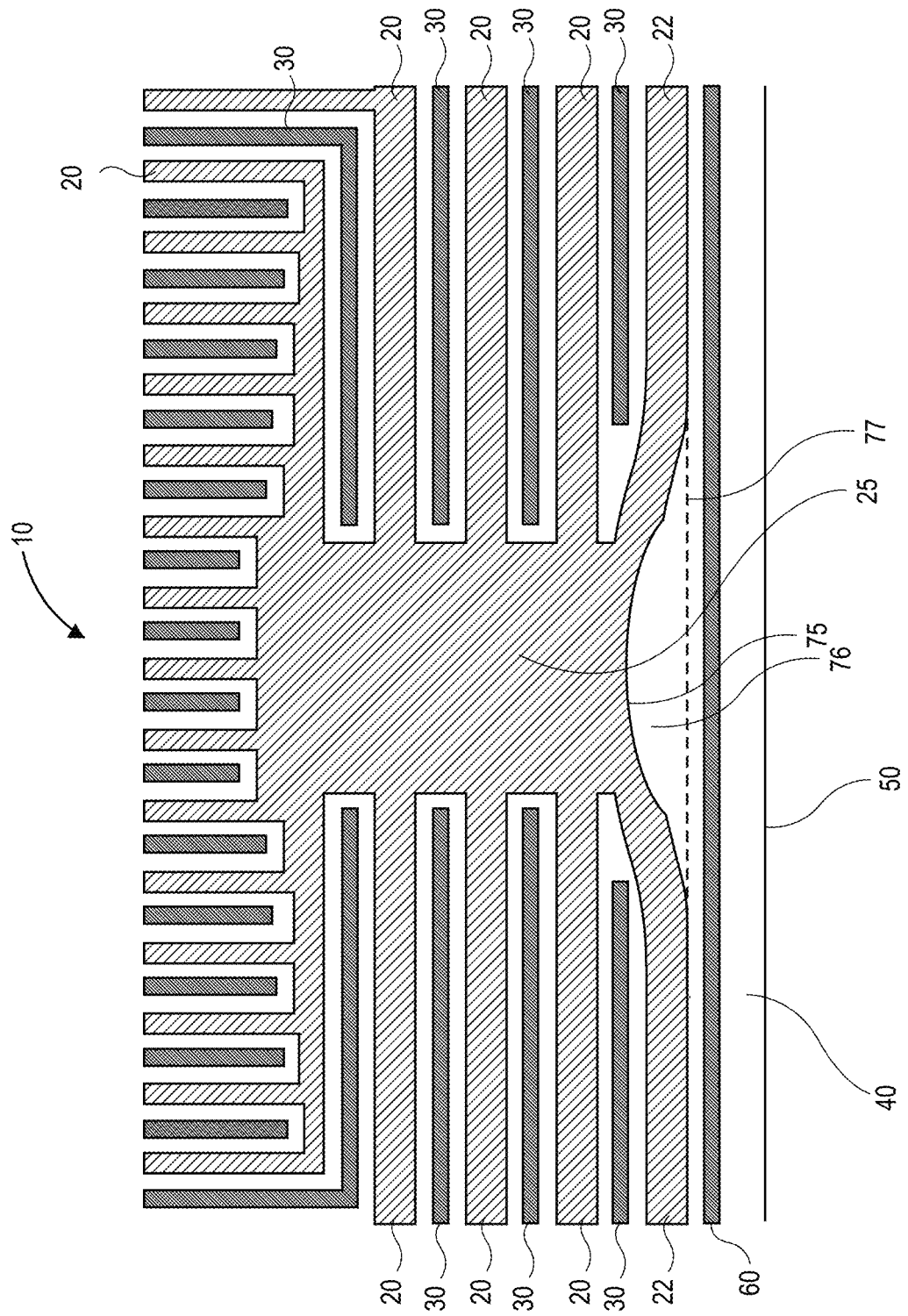
Figure 3A:
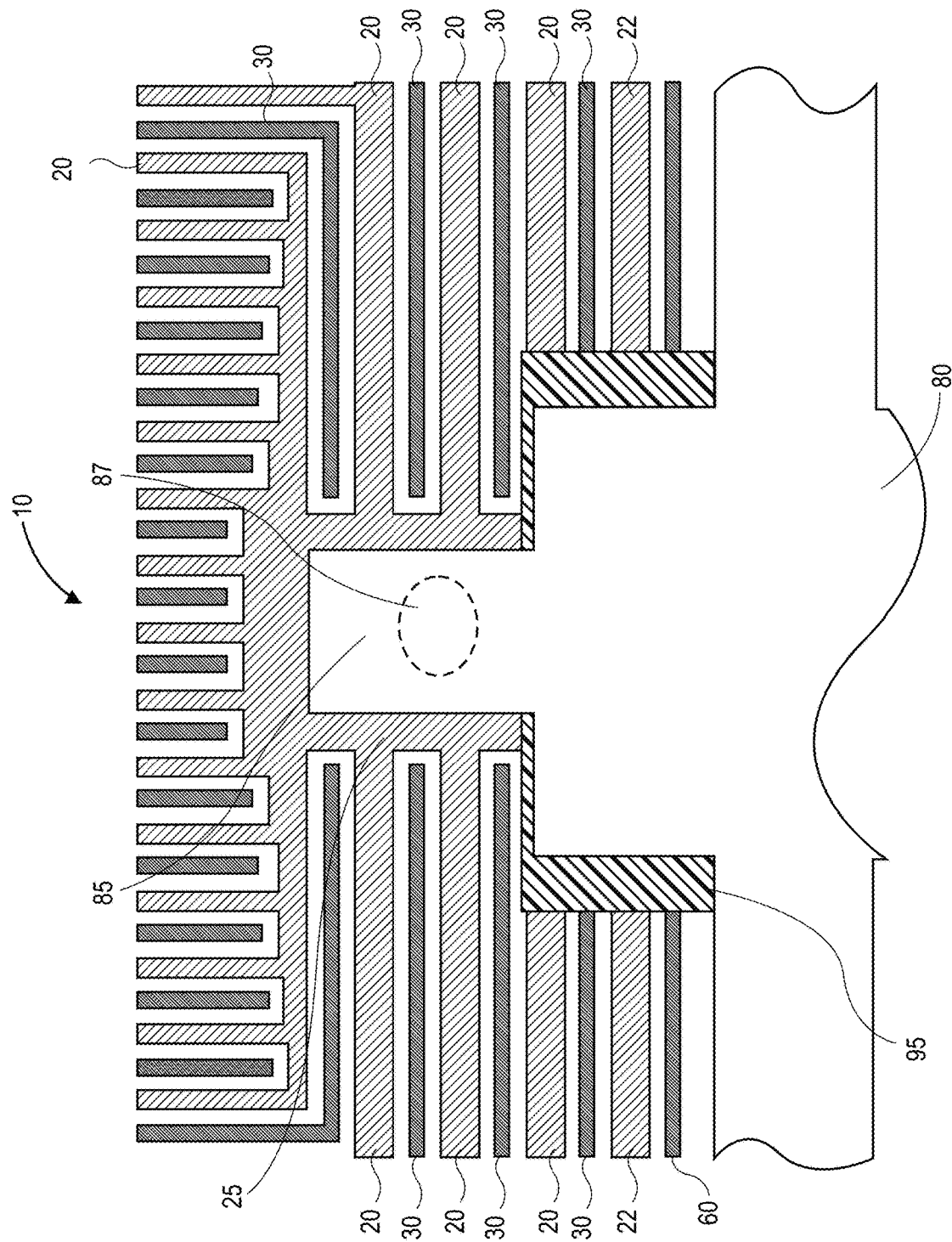
FIGS. 3A and 3B are a schematic representations of an edge portion of a solar cell having a wrap-around metal contact finger connected to an interconnect.
Figure 3B:
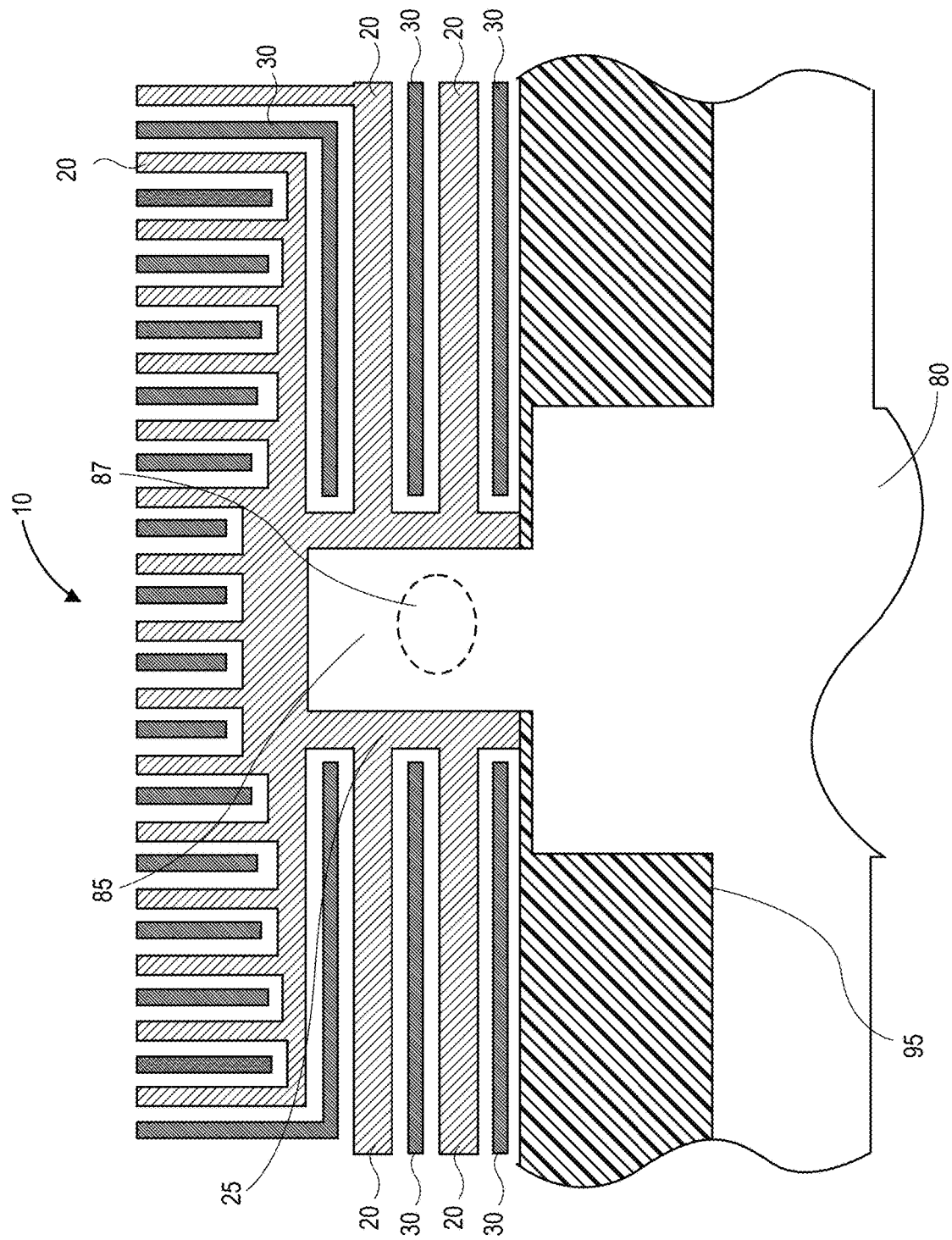

Turning to FIGS. 2A-2C, close ups of a middle portion of a first edge portion of the backside of an example solar cell having a first wrap-around finger is shown, according to some embodiments. In an embodiment, the first edge portion can be a n-type edge and the first wrap-around finger can be a first wrap around p-metal finger. As shown in FIGS. 2A-2C, the solar cell can include a first plurality of metal contact fingers 20 (e.g., interdigitated n-metal contact fingers) and a second plurality of metal contact fingers 30 (e.g., interdigitated p-metal contact fingers). A unique feature of the solar cell 10, as disclosed herein, is the placement of the first wrap-around metal finger 60 between a contact finger 22 (e.g., n-metal finger) closest to the edge 50 of the solar cell 10. In an embodiment, as shown, a wrap-around metal finger 60 can be separated from the edge 50 by a non-metalized region 45. Additionally, shown in FIG. 2A, the bottom end or edge side 75 of the contact pad 25 adjacent to the contact finger 22 can be straight. Also shown in this view is one of the plurality of contact pads 25 that can be used to connect one solar cell 10 to another solar cell in series with an interconnect (see, for example, FIGS. 10A and 10B). In an embodiment, the distance between the wrap-around metal finger 60 to edge can be in a range between approximately, 0.2 mm to 1.2 mm, such as 0.2, 0.3, 0.4, 0.5, 0.6, 0.7, 0.8, 0.9, 1.0, 1.1 or 1.2 mm, or any range or subrange there between. In one example, the distance between the wrap-around metal finger 60 to edge 75 can be in a range between approximately 0.5 mm to 0.8 mm, such as 0.5, 0.6, 0.7, or 0.8 mm, or any range or subrange there between (see, for example, the distance between the edges 50 and the wrap-around metal finger 60 shown in FIGS. 2A-2C). In contrast, in an example, prior to the addition of the wrap-around metal finger, the distance between a n-pad edge to the closest p-metal finger can be 1.0-2.0 mm, such as 1.0, 1.1, 1.2, 1.3, 1.4, 1.5, 1.6, 1.7, 1.8, 1.9, or 2.0 mm, or any range or subrange there between.

Referring again to FIG. 2A-2C, in an embodiment, the contact pad 25 can be conductively coupled to the second plurality of contact fingers 20. In an example, the contact pad 25 can be conductively coupled to the n-metal contact fingers 20. In some examples, the n-metal contact can instead be a p-metal contact. In one example, the second plurality of metal contact fingers 20 can electrically connect to diffusion regions (e.g., n-type diffusion regions) of the solar cell to the contact pad 25 on the first edge portion. While only a single contact pad is depicted, it is contemplated that the contact pad 25, e.g., at a negative edge of the solar cell, can contain or be adjacent to other contact pads. In an example, the solar cell can have from 1 to 10 (e.g. 1, 2, 3, 4, 5, 6, 7, 8, 9 or 10), or even more contact pads. On the opposite end of the solar cell (not shown in this view) the solar cell can include contact pads of an opposite conductivity type to the contact pad 25. These other contact pads can be conductively coupled to a second plurality of metal contact fingers 30 and wrap-around metal finger 60. In an example, the conductively type of the other, opposite, contact pad can be p-type. In one example, the second plurality of metal contact fingers 30 can be p-metal contact fingers 30. Thus, in an example, the second plurality of metal contact fingers 30 and 60 can electrically connect to p-type diffusion regions of the solar cell to the other, opposite, contact pads on the positive edge portion of the solar cell. The contact pad 25 can be electrically coupled, such as soldered, to an electrically conductive connector, such as interconnect or busbar, for example with fingers or tabs extending form the body of the electrically conductive connector (see FIGS. 12A-12D for examples of interconnects and busbars). Likewise, contact pads of an opposite conductivity type (e.g., p-type) can be electrically coupled, such as soldered, to an electrically conductive connector, such as an interconnect. Although specific examples, of interconnects and busbars are shown in FIGS. 12-12D, it is contemplated that other types can be used in the disclosed devices, methods and system.

With reference to FIGS. 2B and 2C the bottom end or edge side 75 of the contact pad 25 need not be straight. For example, as shown in FIGS. 2B and 2C, the edge side 75 of the contact pad 25 can be pinched away from the edge 50 of the solar cell. In an embodiment, there can be an additional space and/or a gap 76 between the edge side 75 of the contact pad 25 and the edge 50 of the solar cell (between the bottom edge side 75 and the dashed line 77). In an example, the gap 76 between the edge side 75 of the contact pad 25 and the edge 50 of the solar cell can further decrease the possibility of shorting between opposite polarity contact fingers. In one example, the additional the gap 76 between the edge side 75 and the edge 50 can prevent misplacement or misalignment of a solder material, or a flow of solder material at the contact pad 25 and the edge 50 as heat is applied. In an example, increasing the distance between the edge side 75 and the edge 50, e.g., through the gap 76, can prevent solder material, or a flow of solder having a width less than 1.0 mm from bridging the edge side 75 or and the edge 50. In an example, the bottom edge 75 of the contact pad 25 can be in a range from approximately 0.3 mm to 1.0 mm from the edge of the solar cells, such as 0.3, 0.4, 0.5, 0.6, 0.7, 0.8, 0.9, or 1.0, or any range or subrange there between. In an embodiment, the edge 75 of the contact pad 25 closest to the edge 50 of the solar cell can be further from the edge 50 of the solar cell than an edge-most of the metal contact fingers 22. As shown in FIG. 2B the bottom edge 75 of the contact pad can be positioned or configured to angle away from the wrap-around metal finger 60 and meet at a straight rounded or other shape for the edge 75 of the contact pad 25. Alternatively, as shown in FIG. 2C, the bottom edge 75 of the solder contact 25 can include a curved edge (single and/or compound curve) going inward and away from the bottom edge 75.

Turning to FIGS. 3A-6, as discussed above, while the presence of a wrap-around metal finger 60 can provide for an increase in the performance of the solar cell 10, the presence on the wrap-around metal finger 60 can cause a short between an interconnect 80 and the wrap-around metal finger 60 when a tab 85 of the interconnect 80 is connected to a contact pad 25. To address this, FIGS. 3A-6 presents examples where an insulating material 95 can be placed between the wrap-around metal finger 60 and a portion of the interconnect 80 that would contact the wrap-around metal finger 60 in the absence of the insulating material 95. As discussed below, with respect to coupling an electrically conductive connector to a solar cell, laser soldering can be used. Thus, in an embodiment, the electrically conductive connector includes a laser solder artifact, for example a laser solder artifact 87 on the tab 85 of the interconnect 80. FIG. 3B illustrates that the insulating material 95 can extend along the edge of the solar cell 10 and need not be just covering the area where the tab 85 is positioned. This is not limited to the embodiment shown in FIG. 3B, as the insulating material can extend along the edge of any solar cell 10, such as in FIG. 6, for example, to the edge before the chamfer, or even past the chamfer, or in the case of the cell shown in FIG. 9B to the edge of a square cell.

Figure 4:
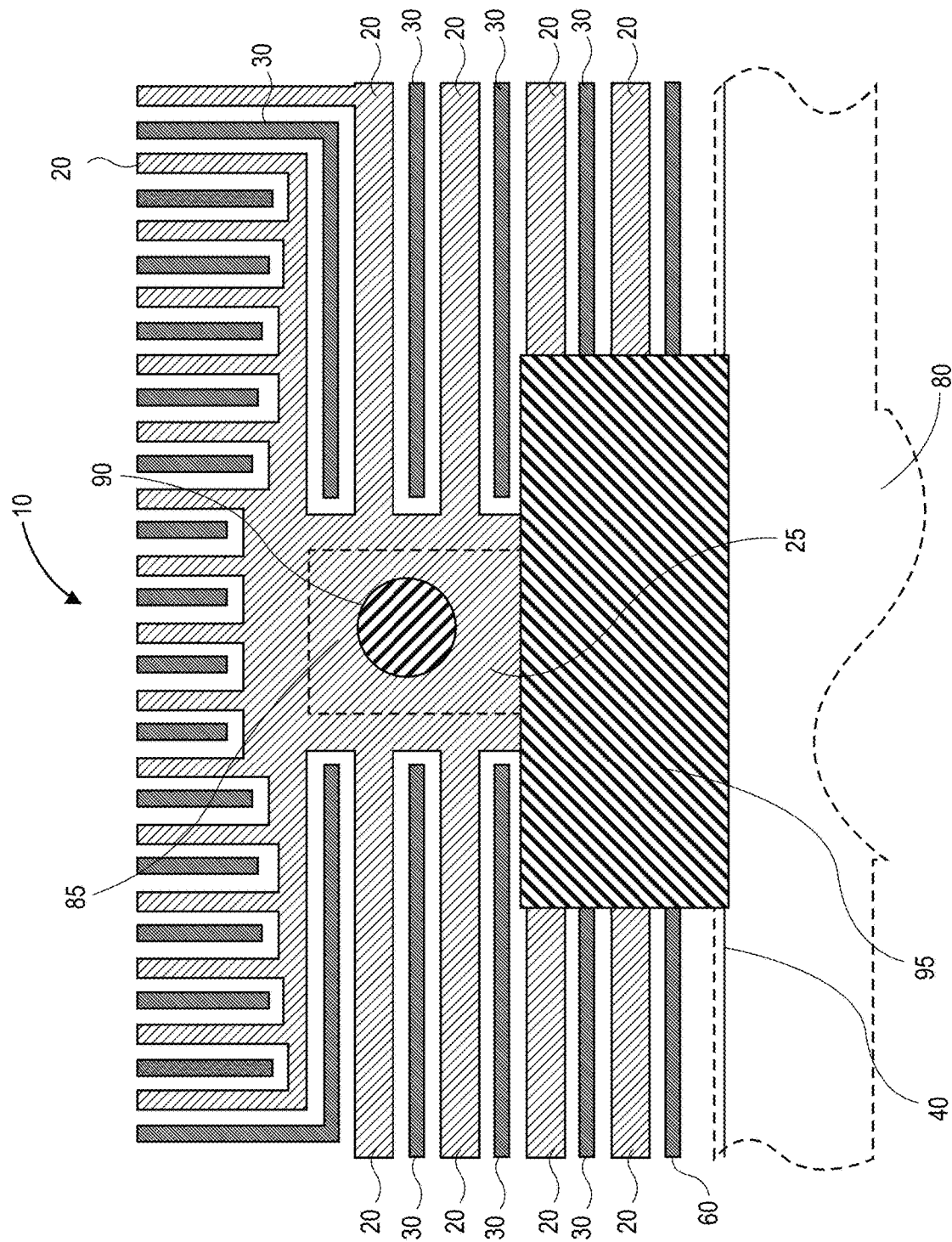
FIG. 4 is a schematic representation of the edge portion of a solar cell having a wrap-around metal finger and the interconnect shown in FIGS. 3A and 3B with the interconnect depicted as transparent in dashed lines.
Figure 5:
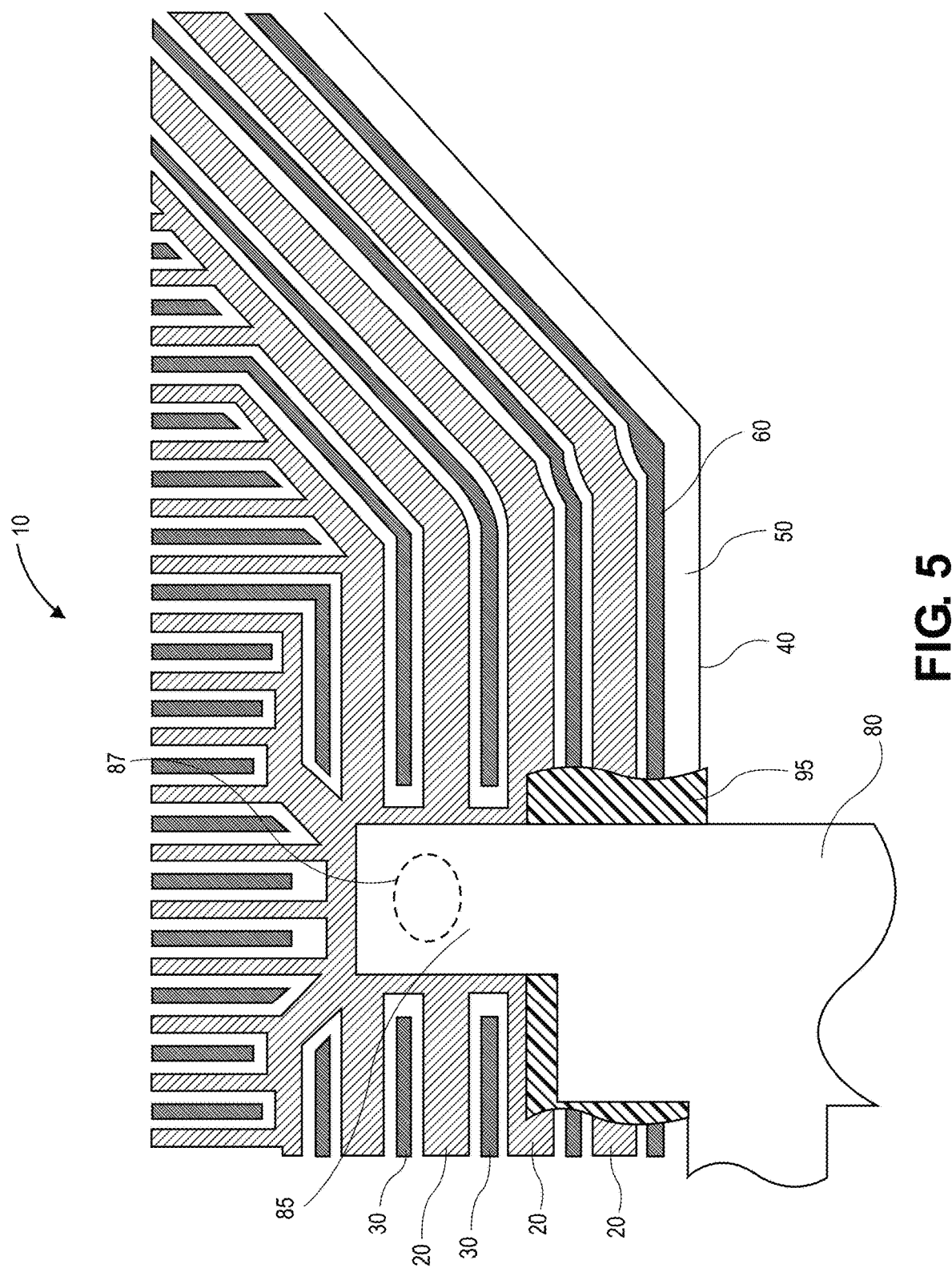
FIG. 5 is a schematic representation of an edge portion of a solar cell having a wrap-around metal finger and an interconnect.
Figure 6:
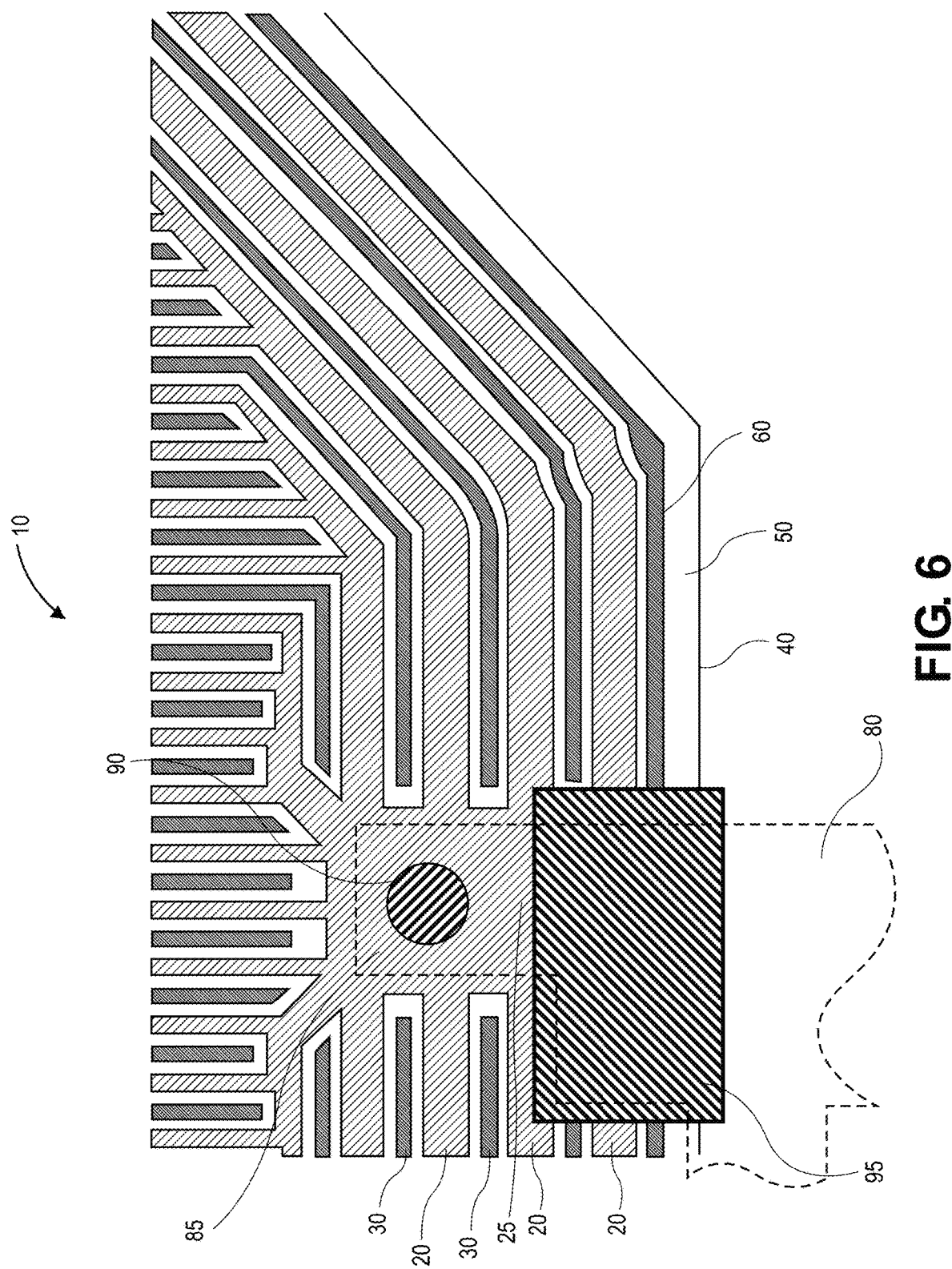
FIG. 6 is a schematic representation of an edge portion of a solar cell having a wrap-around metal finger and the interconnect shown in FIG. 5 with the interconnect depicted as transparent in dashed lines.

Referring again to FIGS. 3A-6, an interconnect 80 placed on a contact pad 25 is shown, according to some embodiments. In an example, referring to FIGS. 3 and 4, an interconnect 80 can be placed on a middle contact pad 25. In another example, referring to FIGS. 5. and 6, an interconnect 80 can be placed on a corner contact pad 25. As shown in FIGS. 4 and 6, dashed lines indicate the position of the interconnect 80 of FIGS. 3A and 3B and 5, respectively, which has been rendered transparent for clarity of the view. Also shown in FIGS. 4 and 6 is a solder material 90 disposed between the contact pad 25 and the interconnect tab 85. To address the potential shorting between the wrap-around metal finger 60 and the interconnect 80, an insulating material 95 can be placed between the wrap-around metal finger 60 and a portion of the interconnect 80 that would contact the wrap-around metal finger 60 in the absence of the insulating material 95.

Referring once again to FIGS. 3A-6, in an example, the insulating material 95 can be selected from any type of material, such as a polymer or mixture of polymers, that do not readily conduct electrical current. In one embodiment, the insulating material can include a cloaking tape or insulating coating with adhesive property to maintain position with the interconnect and/or the solar cell. In certain embodiments, the insulating material can be pre-patterned or patterned as part of the assembly process, for example to align with the tabs of an electrically conductive connector, such as interconnect or busbar. In an embodiment, the insulating material is applied to the solar cell prior to placement and/or soldering of the an electrically conductive connector, such as interconnect or busbar, to the solar cell. In one embodiment, the insulating material is applied to the electrically conductive connector, such as interconnect or busbar, prior to placement and/or soldering of the an electrically conductive connector. In some embodiments, portions of the electrically conductive connector, such as interconnect or busbar, for example the tabs, can be painted with insulating material. In an embodiment, the insulating material can be applied as a tape (e.g., insulating tape) to the an electrically conductive connector, such as interconnect or busbar, for example either before or after the an electrically conductive connector, such as interconnect or busbar, is formed, for example stamped or cut. In other embodiments, the insulating material is applied directly to the solar cell. In some embodiments, the insulating material can be applied directly to the solar cell with the contact pad masked or otherwise excluded from coverage during the solar cell manufacturing process. In some embodiments, the insulating material can be applied over the entire back side of the solar cell. In an example, applying an insulating material over the entire backside can prevent shorts or electrical defects by insulating the entire back side of the solar cell. In an example, the insulating material 95 can be selected from any type of material, such as a polymer or mixture of polymers, that do not readily conduct electrical current. In one example, the insulating material can include solder masks, solder resist, (e.g., polymer, epoxy), silicone and polyimide. In some embodiment, the interconnects can be part of a metalized back sheet, for example used to cover a string and/or an array of solar cells. The insulating material can also assist in alignment of the solar cells, and/or holding the solar cells together. Examples, of insulating materials include polypropylene or polyethylene, which can further include an adhesive layer like an acrylate. An encapsulant material can also serve as an insulating material. An exemplary encapsulant includes one of the same material used to form a solar module from the solar cells described herein, including but not limited to polyolefin, EVA, PVA and PVB encapsulants.

Referring to FIGS. 2A-6, the reference numbers of FIGS. 2A-6 refer to similar elements throughout the figures. In an embodiment, the structure described of the solar cell 10 of FIGS. 2A-6 are substantially similar to the elements of the solar cell 10 of each of FIGS. 2A-6, except as described above. Therefore, the description of corresponding portions of FIGS. 2A-6 applies to the description to each figure of FIGS. 2A-6. In an example, the solar cell 10 of FIG. 6 can correspond to the solar cell of each of FIGS. 2A-6. In one example, the contact pad 25 of FIG. 6 can correspond to the contact pad 25 of each of FIGS. 2A-5.

Figure 7:
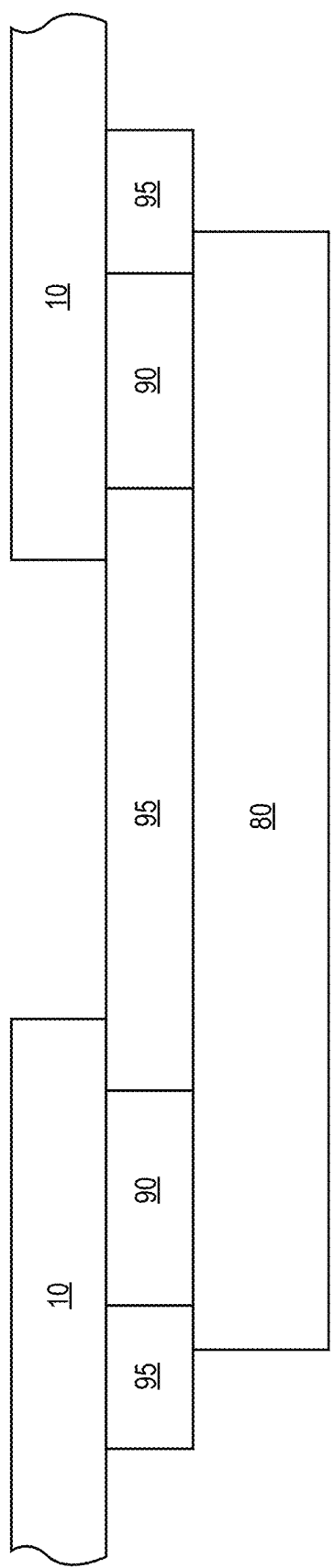
FIG. 7 is a schematic representation of a cross-section of an interconnect connecting two solar cells.

FIG. 7 depicts a cross-section of an example interconnect 80 connecting two solar cells 10. In the embodiment shown the insulating material 95 extends beyond the end of the interconnect 80. Also shown in this view is a gap on the insulating material 95 that allows for placement of the solder material 90 between the solar cells 10 and the interconnect 80. The solder material 90 can be any type of solder paste/flux/ECA/etc. that can be used to facilitate the electrical and/or physical coupling of the interconnect or busbar to the solder pad of the solar cell. In embodiments the solder material is applied to gaps or holes in the insulating material, such as cloaking tape, after the insulating material is applied in alignment with the tab interconnect. In certain embodiments, a release sheet is used over the solder material to prevent contamination, and/or wear during shipping and handling of the individual parts. In some embodiments, the solder material is stencil printed to more precisely place the paste shape and location of the solder material. Other methods of placing the solder material include jet printing solder paste, pre-applying solder to the tabs in the form of printed paste, or a general or targeted plating of solder and optionally the addition of flux, for example by spraying, dispensing, or stencil printing.

Turning to FIG. 8A and FIG. 8B, during manufacture of the solar cells a coating process can result in small blobs 51 of coating deposited at the corners near an edge 50 of the solar cell. These blobs 51 have the potential of impinging on a corner of the wrap-around metal finger 60. As shown in FIG. 8B this can lead to a discontinuity on the electrical continuity of the wrap-around metal finger 60 from the rest of the wafer, thereby rendering the wrap-around metal finger 60 unable to conduct electrical current.

Figure 9A:
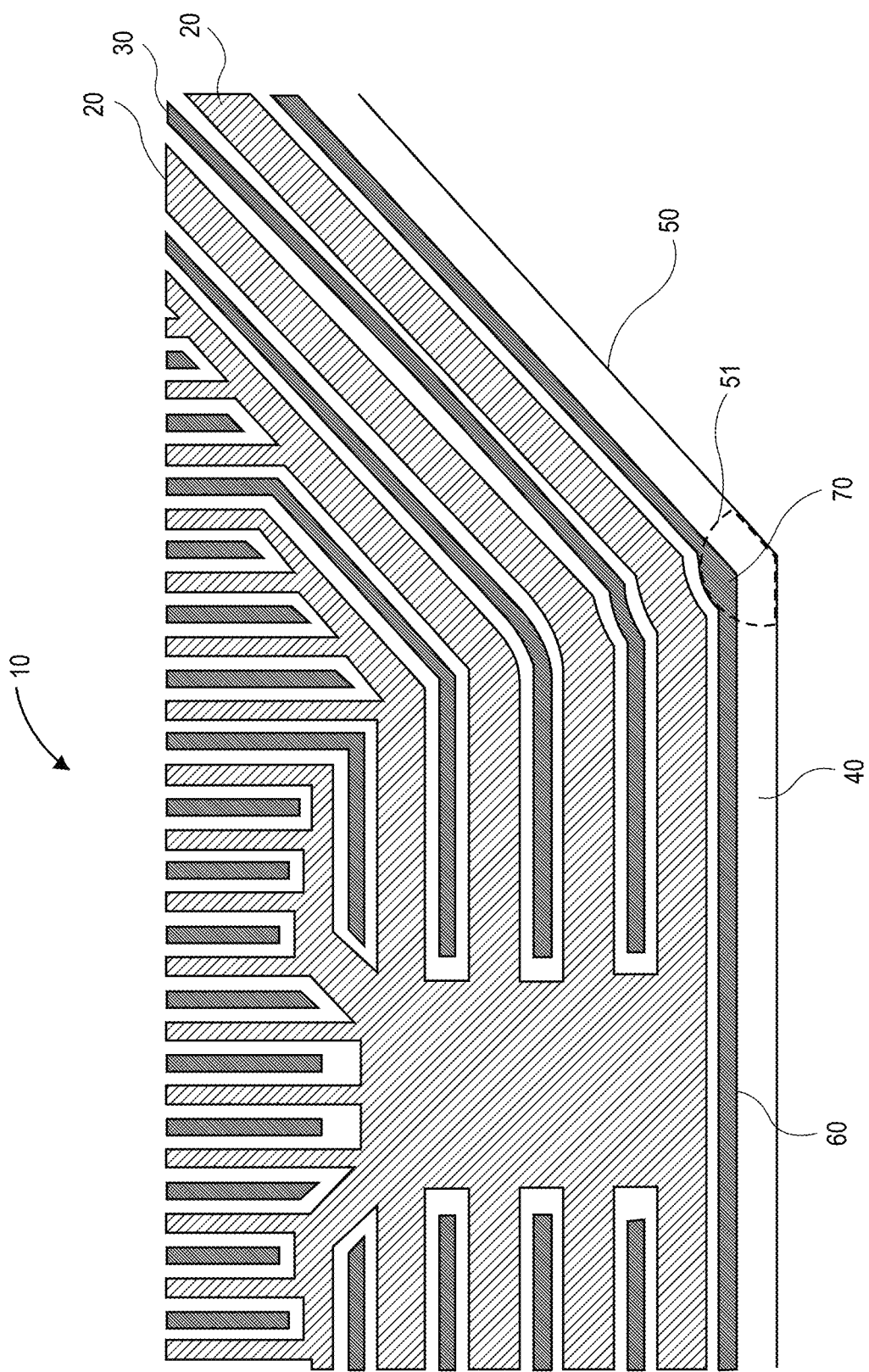
FIGS. 9A-9B are a schematic representations of the corner negative edge of a solar cell having a wrap-around metal finger showing the placement of increased width metal plating to circumvent the blobs of a coating material impinging on the wrap-around metal contact finger.
Figure 9B:
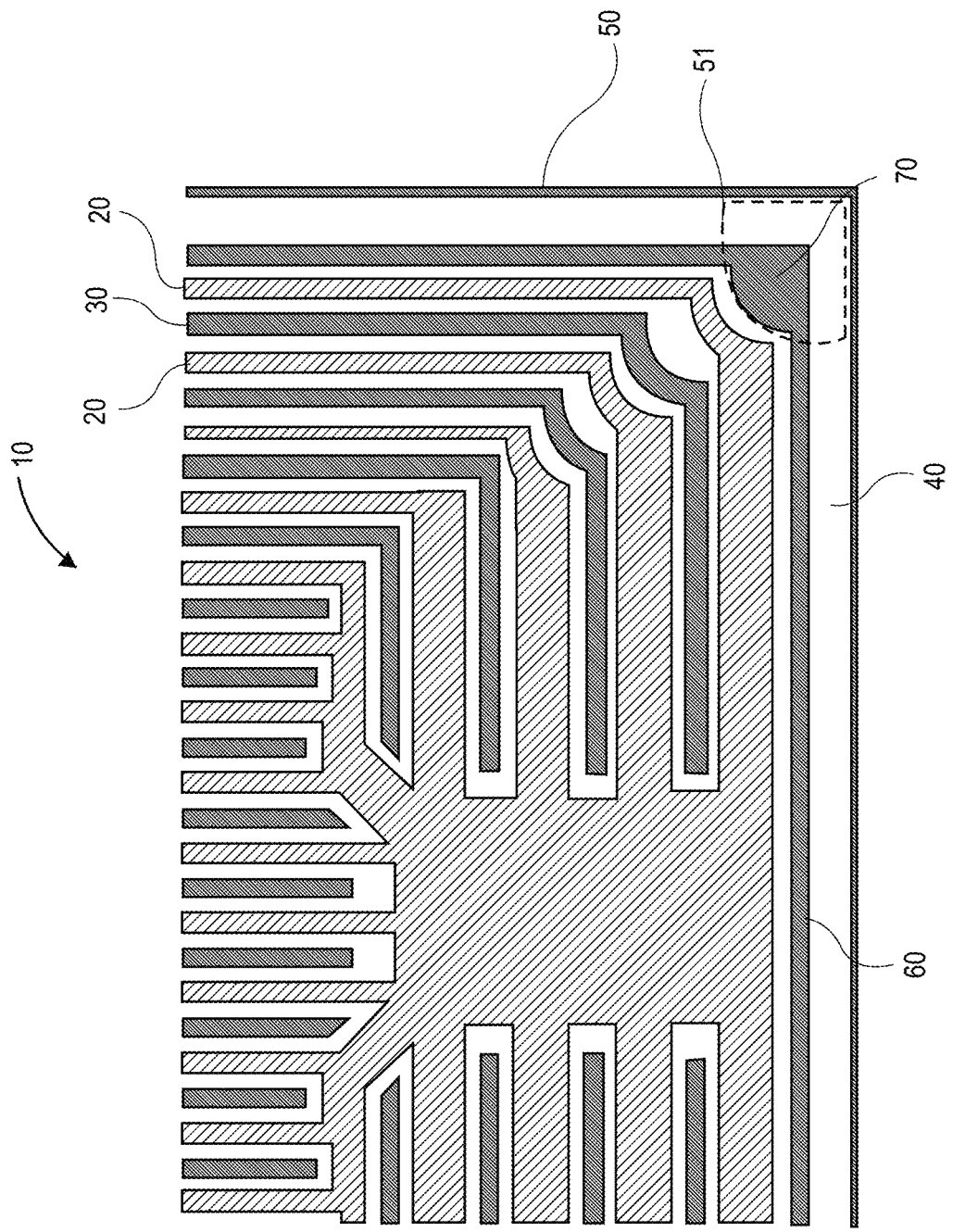

Referring to FIGS. 9A and 9B, to address the potential electrical discontinuity presented in FIG. 8A and FIG. 8B, a corner blob 70 can be formed, according to some embodiments. In an embodiment, the corner blob 70 can increase the width of the p-metal disposed at a corner of the wrap-around metal finger 50. For example, as shown, the corner blob 70 can be have a thickness greater than a potential blob 51 (e.g., ink formed during a coating process) at the corner. In an embodiment, the corner blob 70 can be formed during a metal deposition process, for example such that corner blob 70 can effectively increase the width of the p-metal disposed at a corner of the wrap-around metal finger 50 for a solar cell having it the corners, such as rounded, chamfered, or corners of any degree, such as from 30 degrees to 90 degrees. In an example, referring to FIG. 9B, the corner blob 70 can increase the width of the p-metal disposed at a corner of the wrap-around metal finger 50 for a solar cell having angled corners (as in an approximately 90-degree angled corner for a square solar cell, e.g. FIG. 9A). As shown in FIGS. 9A and 9B, embodiments disclosed herein are applicable to solar cells with rounded corners (not shown) and/or square solar cells with substantially sharp angled corners (e.g., FIG. 9B).

As shown, the solar cell of FIGS. 8A, 8B, 9A, and 9B (a square cell) have similar reference numbers to elements of the solar cell of FIGS. 2-6, where like reference numbers refer to similar elements throughout the figures. In an embodiment, the structure described of the solar cell 10 of FIGS. 8A, 8B, 9A, and 9B are substantially similar to the elements of the solar cell 10 of each of FIGS. 2-6, except as described above. Therefore, the description of corresponding portions of FIGS. 2-6 applies to the description to each figure of FIGS. 8A, 8B 9A, and 9B. In an example, the solar cell 10 of FIGS. 8A, 8B 9A, and 9B can correspond to the solar cell of each of FIGS. 2-6. In one example, the solar cell 10 of FIGS. 8A, 8B 9A, and 9B can correspond to the solar cell 10 of each of FIGS. 2-6.

Figure 10A:
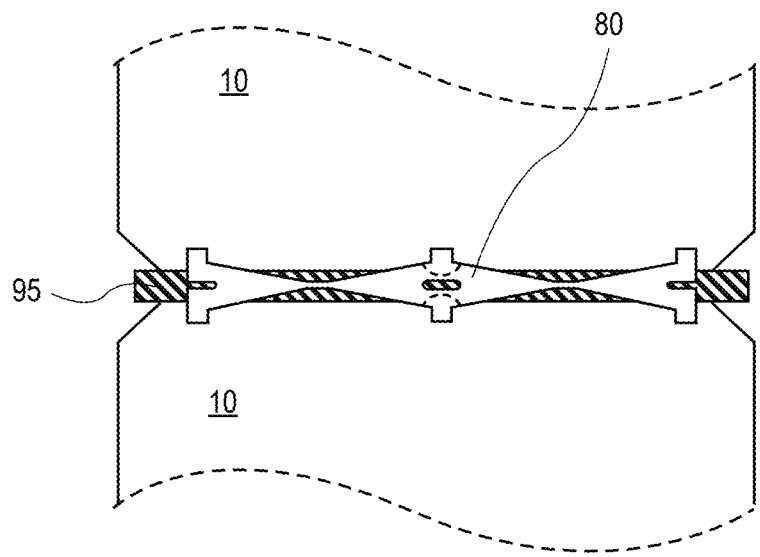
FIG. 10A is a schematic representation of a string of solar cells having a wrap-around metal contact fingers and connected by interconnects.
Figure 10B:
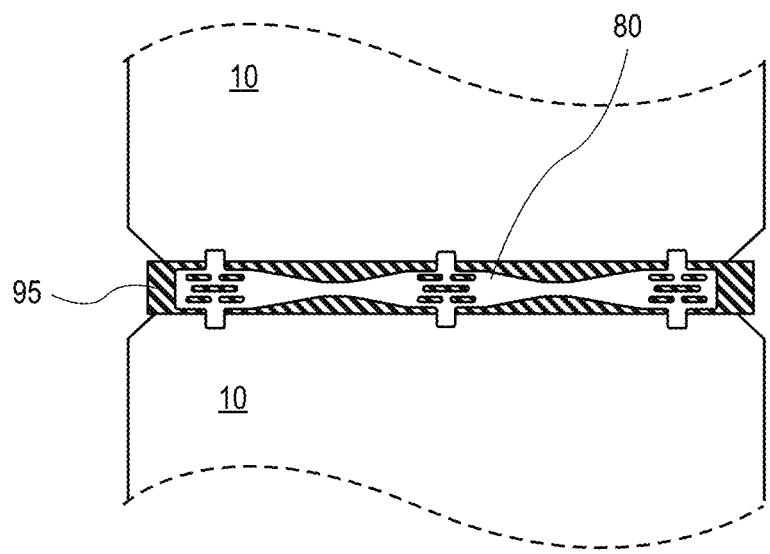
FIG. 10B is a schematic representation of a string of solar cells having a wrap-around metal contact fingers and connected by interconnects.

Turning to FIGS. 10A and 10B, a string of solar cells is shown, according to some embodiments. In an embodiment, as shown, individual solar cells 10 can be connected by interconnects 80 to form a string of solar cells. As shown in FIG. 10D, these strings of solar cells 10 can be connected to a busbar 100 to create a solar cell matrix or an array of solar cells. Thus, several solar cells 10 can be connected together to form a solar cell array. As shown in FIGS. 10A and 10B, in a solar cell array, a conductive area coupled to a p-doped of one solar cell 10 is connected to a conductive area coupled to an n-doped region of an adjacent solar cell 10, for example, with an interconnect 80, which is positioned over an insulating material 95, such as an insulating tape. The positive area of the adjacent solar cell 10 is then connected to a negative area of a next adjacent solar cell 10 and so on. This stringing of solar cells 10 can be repeated to connect several solar cells in series to increase the output voltage of the solar cell array.

Figure 10C:
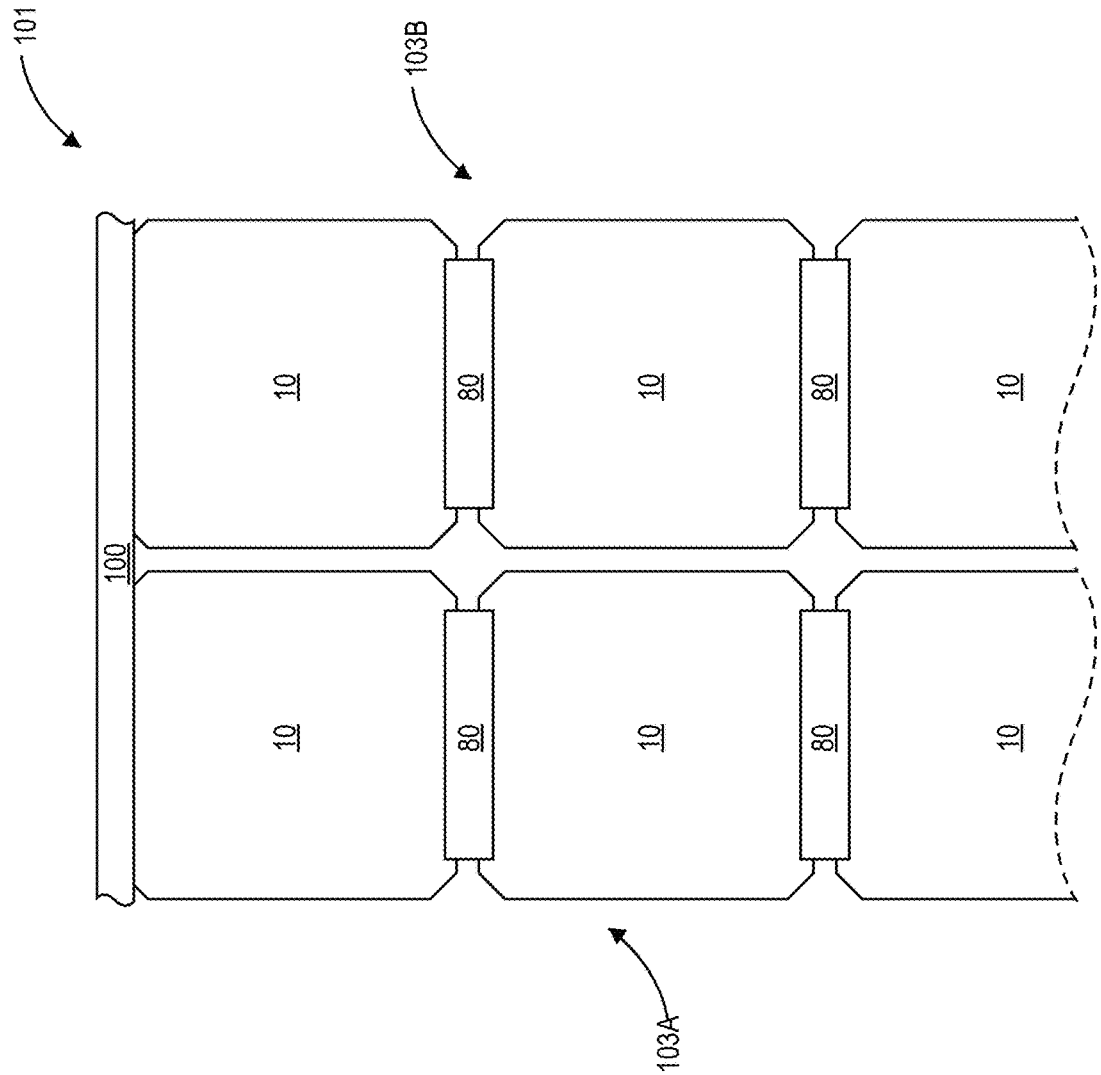
FIG. 10C is a schematic representation of multiple strings of solar cells having a wrap-around metal contact fingers and connected by interconnects and a busbar to form a solar cell array.

Referring to FIG. 10C, there is shown a solar cell matrix. In an embodiment, a solar cell matrix 101 can include a plurality of solar cell strings 103A, 103B electrically connected by a busbar 100. As shown the bus bar can extend in either direction, for example, so that multiple solar cell strings can be connected in parallel. In other examples the solar cell strings can be connected in series, for example through the bottom and/top of the strings. In other examples the solar cell strings can be connected in a mixture of parallel and series arrangements. The individual solar cell strings can be of any length, for example is shown in FIG. 10C extending downward. In an example, the solar cell strings 103A and 103B can include the solar cell strings described in FIGS. 10A and 10B. Thus, the embodiments described herein can be used in a solar cell matrix. In an embodiment, the solar cell matrix can also be referred to as an array of solar cells.

Aspects of the present disclosure further concern a method of coupling a solar cell and an interconnect. An exemplary flow 1100 for coupling a solar cell and an interconnect and optionally a second solar cell is given in FIG. 11. While the method is discussed in FIG. 11 is with respect to an interconnect, it understood that this method is applicable to electrically conductive connector, examples of which are an interconnect and a busbar.

Figure 11:
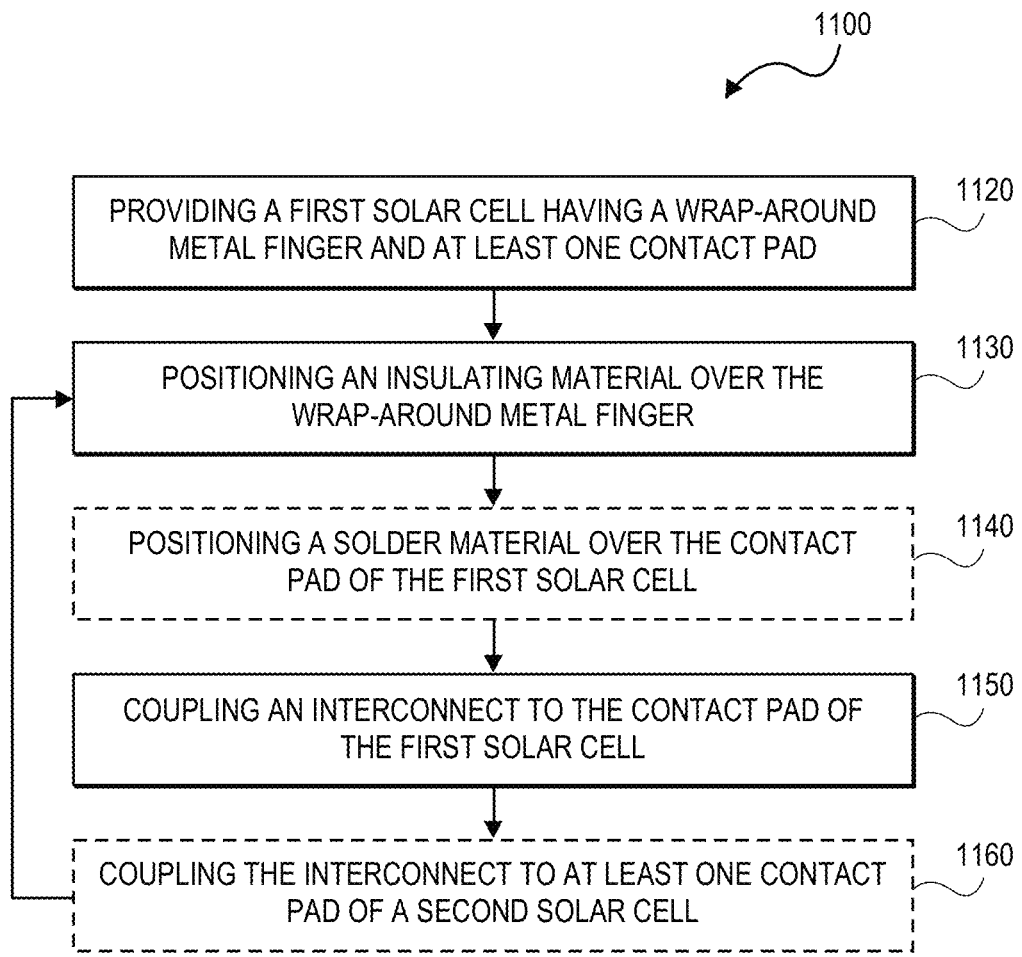
FIG. 11 is a block diagram depicting an example flow for producing an interconnected string of solar cells having wrap-around metal.

Turning to FIG. 11, a flowchart 1100 illustrating a method of coupling a solar cell and an interconnect is shown, according to some embodiments. In various embodiments, the method described in FIG. 11 can include additional (or fewer) blocks than illustrated. In an example, positioning a solder material over the contact pad of a first solar cell (e.g., block 1140) is optional and need not be performed. In one such example, the solder material can already be positioned or pre-formed on an interconnect.

With reference to block 1120 of flowchart 1100, a method of coupling a solar cell and an interconnect can include providing a first solar cell that includes a wrap-around metal finger and at least one or more of contact pads, according to some embodiments. In embodiments, the first solar cell includes a wrap-around metal finger that passes between a first edge of the solar cell and a first contact pad of the first solar, such as described herein. In embodiments, the first solar cell includes a wrap-around metal contact finger that passes between a first edge of the first solar cell and at least one first contact pad of the first solar cell, wherein the first contact pad is of opposite polarity to the wrap-around metal contact finger. In an embodiment, the wrap-around metal finger can be a wrap-around positive metal contact finger. In an example, the solar cell can include a plurality of negative metal contact fingers, each of the negative metal contact fingers being coupled to one or more n-type diffusion regions on a backside of the solar cell. In an embodiment, the one or more contact pads can also be referred to as a plurality of contact pads. In one embodiment, the solar cell can include a first plurality of contact pads on an edge of the solar cell. In an example, the first plurality of contact pads can be negative contact pads and the edge can be a negative edge, e.g., an edge adjacent to the negative contact pad. In an embodiment, each of the first plurality of contact pads can provide a surface on which an interconnect can be attached to electrically couple to a n-type diffusion region by way of the negative metal contact fingers. In an embodiment, the solar cell can include a first plurality of metal contact fingers (e.g., positive metal contact fingers) interdigitated with a second plurality of metal contact fingers (e.g., negative metal contact fingers), wherein at least one of the first plurality of metal contact fingers includes the wrap-around metal finger that passes between the edge of the solar cell and at least one of the first plurality of contact pads.

Referring to block 1130 of flowchart 1100, the method of coupling a solar cell and an interconnect can include positioning an insulating material over the wrap-around metal finger. The insulating material is positioned so that an interconnect coupled to the first solar will not come in physical or electrical contact with the wrap-around metal finger. In an embodiment, positioning the insulating material includes applying the insulating material to the interconnect. In some embodiments, positioning the insulating material includes applying the insulating material to the solar cell. In one embodiment, the insulating material includes a cloaking tape or insulating coating with adhesive property to maintain position with the interconnect and/or the solar cell. In an embodiment, the insulating material is pre-patterned or patterned as part of the assembly process to align with the tabs of the interconnect. In an embodiment, the insulating material is applied to the solar cell prior to placement and/or soldering of the interconnect to the solar cell. In one embodiment, the insulating material is applied to the interconnect prior to placement and/or soldering of the interconnect to the solar cell. In an embodiment, portions of the interconnect, such as the tabs, can be painted with insulating material. In an embodiment, the insulating material can be applied as a tape to the interconnect, for example either before or after the interconnect is formed, for example stamped or cut. In an embodiment, the insulating material is applied directly to the solar cell. In an embodiment, the insulating material is applied directly to the solar cell with the contact pad areas masked or otherwise excluded from coverage during the solar cell manufacturing process. In some embodiments, the insulating material can be applied over the entire back side of the solar cell. In an example, applying an insulating material over the entire backside can prevent shorts or electrical defects by insulating the entire back side of the solar cell.

Referring to block 1140 of flowchart 1100, the method of coupling a solar cell and an interconnect can include positioning a solder material between a tab of the interconnect and one or more contact pads. In embodiments, the solder material is applied to the interconnect tab. In embodiments, the solder material is applied to the solar cell. The solder material can be any type of solder paste/flux/ECA/etc. that can be used to facilitate the electrical and/or physical coupling of the interconnect to the contact pad of the solar cell. In embodiments the solder material is applied to gaps or holes in the in the insulating material, such as cloaking tape, after the insulating material is applied in alignment with the tab interconnect. In certain embodiments, a release sheet is used over the solder material to prevent contamination, and/or wear during shipping and handling of the individual parts. In some embodiments, the solder material is stencil printed, for example, to more precisely place the paste shape and location. Methods of placing the solder include jet printing solder paste, pre-applying solder to the tabs in the form of printed paste, or a general or targeted plating of solder plus and optionally the addition of flux, for example by spraying, dispensing, or stencil printing. As shown, block 1140 can be an optional step, e.g., block 1140 need not be performed. In an embodiment, the interconnect can be dispensed from a reel or a spool and placed on or over the contact pad of the solar cell. In some embodiments, the interconnect can be interchanged with a busbar and also dispensed from a reel or a spool.

Referring to block 1150 of flowchart 1100, the method of coupling a solar cell and an interconnect can include coupling an interconnect to one or more of the contact pads. In an embodiment, coupling an interconnect can include soldering the interconnect. In an example, some methods of coupling an interconnect to a solar cell can include induction soldering. However, induction soldering can lead to non-localized heating damage to the insulating material. Alternatively, laser soldering can have much less non-localized heat damage. In one embodiment, coupling an interconnect can include laser soldering. In an example, performing a laser soldering process can increase the speed at which the soldering process and provide for a more accurate and precise heating at the interconnect and minimize the spread of the solder paste at the contact pad (e.g., at a negative solder pad). In an embodiment the interconnect can be coupled by welding. As described above, in an embodiment, the one or more contact pads can also be referred to as a plurality of contact pads. In an example, a laser welding process can be used to couple the interconnect to one of the plurality of contact pads. In an embodiment, performing a laser soldering process can mark or leave a visible indentation and/or mark on the interconnect. In an example, the laser soldering can provide for a laser solder artifact on the interconnect. In an example, as used in FIG. 11, interconnect and busbar can be used interchangeably, thus descriptions which apply to an interconnect also apply to a busbar. Thus, in some embodiments, the laser soldering allows for a laser solder artifact on a busbar. In one embodiment, the interconnect and busbar can be referred to as an electrically conductive connector.

Referring to block 1160 of flowchart 1100, the method of coupling the first solar cell and an interconnect can include coupling an interconnect to one or more contact pads of a second, different, solar cell. In some embodiments, the method includes providing a second solar cell comprising at least one second contact pad of opposite polarity to the first contact pad of the first solar cell. In an embodiment, the one or more contact pads can also be referred to as a plurality of contact pads. In an example, coupling the first solar cell and the interconnect to one or more contact pads can include coupling the first solar cell and an interconnect to one or more of a first plurality of contact pads of a second, different, solar cell. In an embodiment, coupling the first solar cell and an interconnect to one or more of the first plurality of contact pads of a second, different, solar cell can include connecting the first solar cell and second solar cell in series. In an embodiment, the second plurality of contact pads can be a second plurality of positive contact pads. As shown, block 1160 can be an optional step, e.g., block 1160 need not be performed. In an embodiment, the method can further include electrically coupling a busbar to at least one third contact pad, for example a contact of the first solar cell or second solar cell. In one example, the third contact pad is of opposite polarity to the first contact pad. In another example, the third contact pad is of opposite polarity to the second contact pad.

Referring to blocks 1130-1160 of flowchart 1100, the process can be repeated. In an embodiment, blocks 1130-1160 can repeated to create strings of solar cells. In an embodiment, there is no limit the length of a string of solar cells created in this way. In an example, a string of solar cells including 2 or more cells can be created.

Figure 12A:
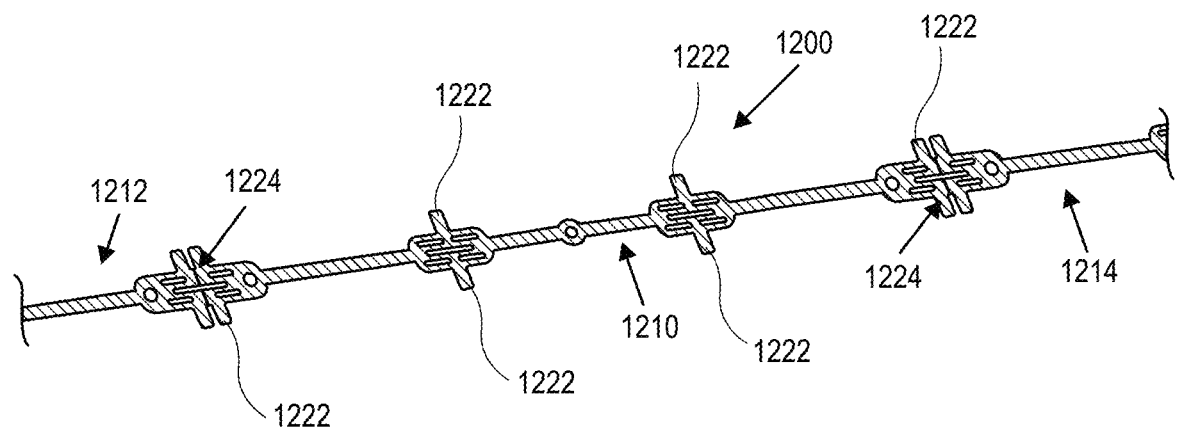
FIG. 12A is a schematic representation of interconnects.

Referring to FIG. 12A, an example of a plurality of interconnects 1200 is shown, according to some embodiments. As shown, the plurality of interconnects 1200 can be connected at ends 1224 of each individual interconnect 1210, 1212, 1214. In one embodiment, connecting the plurality of interconnects at ends 1224 can allow for the plurality of interconnects 1200 to be collected in a reel or a spool. In an embodiment, the plurality of interconnects 1200 can have tabs 1222 for connecting to a conductive pad (e.g., solder pad) of a solar cell. In an example, the tabs 1222 can extend outward from each individual interconnect 1210, 1212, 1214. In one example, the tabs 1222 can extend perpendicular to each of the individual interconnects 1210, 1212, 1214. Referring to FIG. 12A and flowchart 1100 of FIG. 11, in an embodiment, the interconnect 1200 can be dispensed from a reel or a spool and placed on or over a contact pad of a solar cell.

Figure 12B:
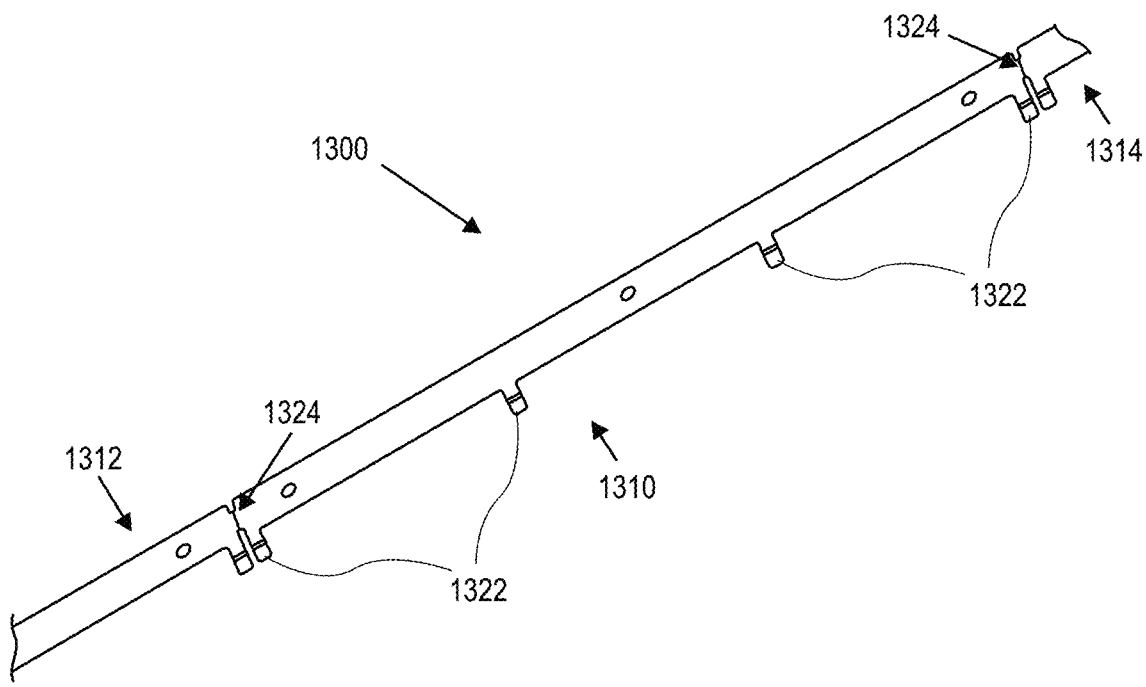
FIG. 12B is a schematic representation of busbars.

Referring to FIG. 12B, an example of a plurality of busbars 1300 is shown, according to some embodiments. As shown, the plurality of busbars can be connected at the ends 1324 of each individual busbar 1310, 1312, 1314. In one embodiment, connecting the plurality of busbars at ends 1324 can allow for the plurality of busbars 1300 to be collected in a reel or a spool. In an embodiment, the plurality of busbars 1300 can have tabs 1322 for connecting to a conductive pad (e.g., solder pad) of a solar cell. In an example, the tabs 1322 can extend outward from each individual busbars 1310, 1312, 1314. In one example, the tabs 1322 can extend perpendicular to each of the individual busbars 1310, 1312, 1314. Referring to FIG. 12B and flowchart 1100 of FIG. 11, in an embodiment, the interconnect 1300 can be dispensed from a reel or a spool and placed on or over a contact pad of a solar cell.

Figure 12C:
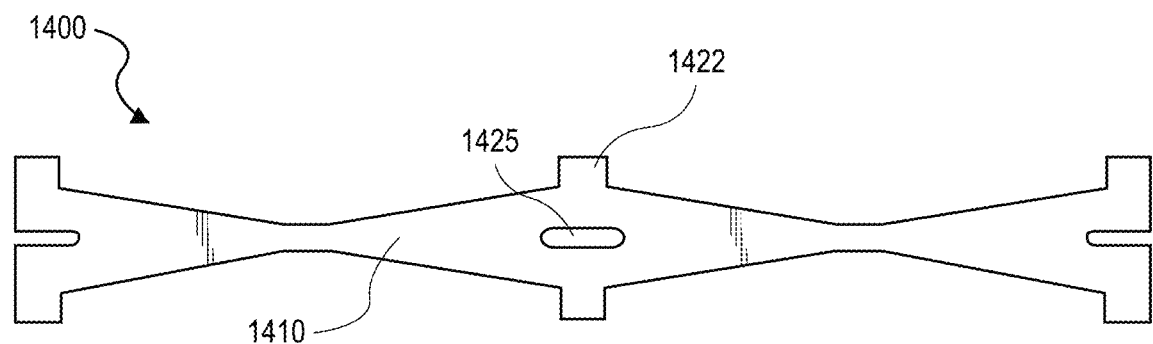
FIG. 12C is a schematic representation of an interconnect.
Figure 12D:
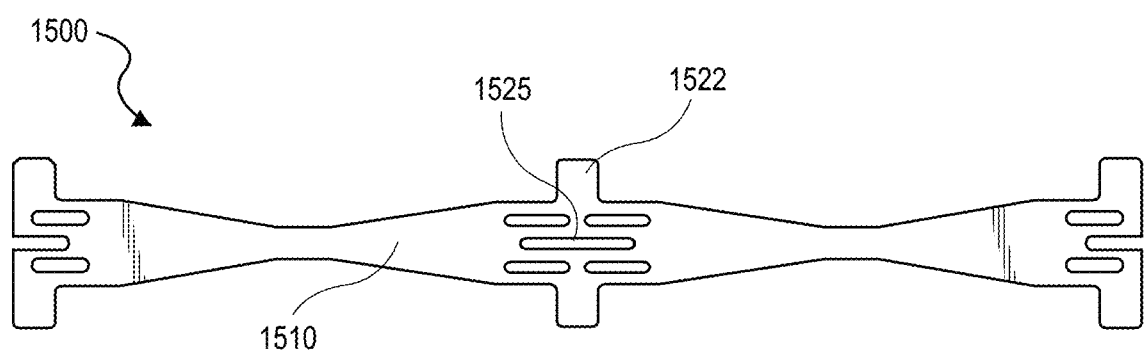
FIG. 12D is a schematic representation of an interconnect.

Referring to FIG. 12C, an example of an interconnect is shown. In an embodiment, the interconnect 1400 can have tabs 1422 for connecting to a conductive pad (e.g., solder pad) of a solar cell. In an example, the tabs 1422 can extend outward from each individual interconnect 1400. In one example, the tabs 1422 can extend perpendicular to each of the interconnect 1400. In embodiments, the interconnect 1400 can include strain relief features 1425.

Referring to FIG. 12D, an example of an interconnect is shown. In an embodiment, the interconnect 1500 can have tabs 1522 for connecting to a conductive pad (e.g., solder pad) of a solar cell. In an example, the tabs 1522 can extend outward from each individual interconnect 1500. In one example, the tabs 1522 can extend perpendicular to each of the interconnect 1500. In embodiments, the interconnect 1500 can include strain relief features 1525. Examples of interconnects can be found in U.S. Pat. No. 9,691,924, issued Jun. 27, 2017, which is hereby incorporated herein by reference in its entirety.

Figure 13A:
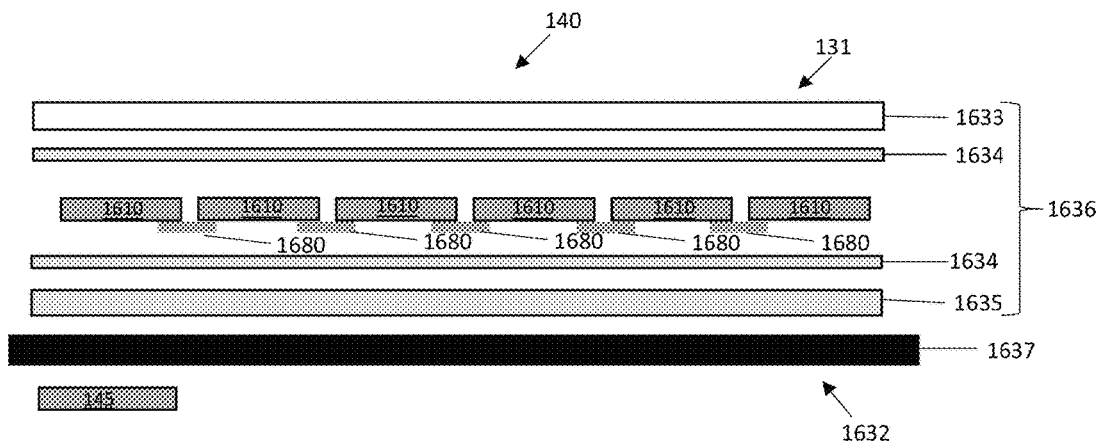
FIGS. 13A and 13B illustrate cross-sectional views of an example solar cell module.

The solar cell stings and arrays as described herein can be included in a solar panel, solar module, solar laminate and/or a flexible type solar panel. Referring again to FIG. 13A, in an embodiment, top and bottom encapsulants 1634 can surround the solar cells 1610, e.g., encapsulate the solar cells 1610. In an embodiment, a cover layer 1633 can be placed over the encapsulant 1634, the solar cells 1610, interconnects 1680, and backsheet 1635. In an embodiment, placing the cover layer 1633 over the encapsulant 1634 can include placing glass over the encapsulant 1634. In an embodiment, the cover layer 1633 can include glass or a polymer material (e.g., a clear, opaque or transparent polymer material). In an embodiment, the encapsulant 1634 can include ethylene vinyl acetate (EVA), polyolefin and/or other encapsulant materials. In an embodiment, a lamination process and/or a thermal process can be performed to form a solar laminate 1636. In an embodiment, the solar laminate 1636 can include the cover layer 1633, encapsulant 1634, the solar cells 1610, interconnects 1680 and backsheet 1635. In one example, the lamination process and/or a thermal process can include heating the encapsulant 1634 the solar cells 1610. In an example, the cover layer 1633, encapsulant 1634, the solar cells 1610, interconnects 1680 and backsheet 1635 can undergo a lamination and/or a thermal process to form the solar laminate 1636. In an embodiment, the solar laminate can be placed in a frame 1637. In an embodiment, a junction box 1645, e.g., a box including bypass diodes, micro-inverters and/or other electronics can be attached to the frame 1637. Thus, in an embodiment a solar module 1640 can be formed. In an embodiment, the solar module 1640 can have a front side 1631, e.g., which faces the sun during normal operation, and back side 1632 which is opposite the front side 1631. Although as shown, a solar laminate is enclosed or is part of the solar module 1640, in some products the solar laminate can be formed on its own (e.g., the solar laminate can be its own product). In an example, a flexible type solar panel can include the solar laminate 1636 (e.g., without the frame 1637). In some embodiments, the solar panel, solar module, solar laminate and/or a flexible type solar panel can also be referred to as a photovoltaic panel, photovoltaic module, photovoltaic laminate and/or a flexible type photovoltaic panel, respectively.

Figure 13B:
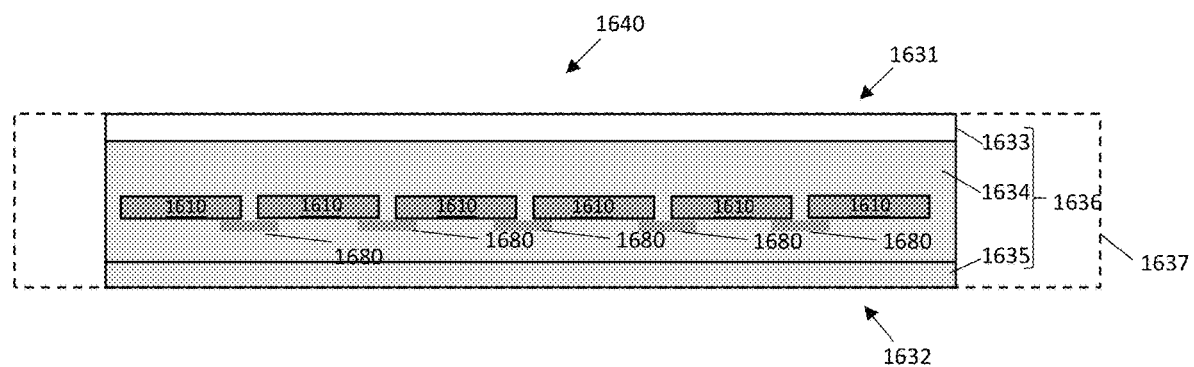

Referring to FIG. 13B, a solar panel, solar module, solar laminate and/or a flexible type solar panel and/or laminate formed is presented. In an embodiment, the solar module 1640 can have a front side 1631, e.g., which faces the sun during normal operation, and back side 1632 which is opposite the front side 1631. In an embodiment, the solar module 1640 can include a solar laminate 1636. In an embodiment, the solar laminate can include a cover layer 1633, encapsulant 1634, the solar cells 1610, interconnects 1680 and backsheet 1635. In an embodiment, the interconnect portions can be disposed over the back sides of the solar cells 1610. In an embodiment, at least a portion of the solar cells 1610 are arranged in parallel or in series. In an embodiment, at least a portion of the solar cells 1610 are arranged as a string of solar cells. In an embodiment, at least a portion of the solar cells 1610 are arranged as an array of solar cell strings. In an embodiment, the encapsulant 1634 can include ethylene vinyl acetate (EVA), polyolefin and/or other encapsulant materials. Although as shown, a solar laminate 1636 is enclosed or part of the solar module 1640, in some products the solar laminate 1636 can formed and sold separately (e.g., as a separate product). In an example, a flexible type solar panel can include the solar laminate 1636 (e.g., without the frame 1637). Also, although not shown, one or more junction boxes can be located as part of the solar module 140, connected to the frame 1637 or connected to the solar laminate 1636.

EXAMPLES

The following examples are set forth to exemplify certain embodiments of this disclosure.

Example A1 is a solar cell comprising:
a first plurality of metal contact fingers, each of the first plurality of metal contact fingers coupled to one or more first diffusion regions on the backside of the solar cell;
at least one contact pad on a first edge of the solar cell electrically coupled to the first plurality of metal contact fingers; and
a second plurality of metal contact fingers interdigitated with the first plurality of metal contact fingers, each of the second plurality of metal contact fingers being coupled to one or more second diffusion regions on the backside of the solar cell, wherein at least one of the first plurality of metal contact fingers comprises a wrap-around metal finger that passes between the first edge of the solar cell and the at least one contact pad.

Example A2 includes the subject matter of example A1, or any other example herein, further comprising: an electrically conductive connector soldered to the at least one contact pad; and an insulating material positioned between the electrically conductive connector and the wrap-around metal finger and configured to prevent a short between the electrically conductive connector and the wrap-around metal finger.

Example A3 includes the subject matter of example A2, or any other example herein, wherein the electrically conductive connector comprises an interconnect or a busbar.

Example A4 includes the subject matter of example A2, or any other example herein, wherein the electrically conductive connector further comprises a laser solder artifact.

Example A5 includes the subject matter of example A1, or any other example herein, wherein the first plurality of metal contact fingers comprises a first plurality of p-metal contact fingers.

Example A6 includes the subject matter of example A1, or any other example herein, wherein the distance between the wrap-around metal finger and the first edge is within a range of approximately 0.2 mm to 1.2 mm.

Example A7 includes the subject matter of example A1, or any other example herein, wherein the distance between the wrap-around metal finger and the first edge is within a range of approximately 0.6 mm to 0.8 mm.

Example A8 includes the subject matter of example A1, or any other example herein, further comprising an adhesive adhered to the insulating material.

Example A9 includes the subject matter of example A1, or any other example herein, wherein the insulating material comprises an insulating tape.

Example A10 includes the subject matter of example A1, or any other example herein, wherein an edge of the at least one contact pad closest to the first edge of the solar cell is further from the edge of the solar cell than an edge-most of the first plurality of metal contact fingers.

Example B1 is a photovoltaic (PV) string comprising:
a first solar cell comprising:
at least one first contact pad on a first edge of the solar cell; and
a first plurality of metal contact fingers interdigitated with a second plurality of metal contact fingers, wherein at least one of the first plurality of metal contact fingers comprises a wrap-around metal finger that passes between the first edge of the solar cell and the at least one first contact pad;
a second solar cell;
an interconnect that electrically connects the at least one first contact pad of the first solar cell to a contact pad of the second solar cell; and
an insulating material positioned between the interconnect and the wrap-around metal finger, the insulating material configured to prevent a short between the interconnect and the wrap-around metal finger.

The solar array of claim 10, further comprising an adhesive adhered to the insulating material.

Example B2 includes the subject matter of example B1, or any other example herein, wherein the insulating material comprises an insulating tape.

Example B3 includes the subject matter of example B1, or any other example herein, wherein the interconnect further comprise a laser solder artifact.

Example B4 includes the subject matter of example B1, or any other example herein, further comprising a busbar electrically connected to a contact pad of the first solar cell.

Example B5 includes the subject matter of example B1, or any other example herein, wherein the first plurality of metal contact fingers comprises a first plurality of p-metal contact fingers.

Example C1 is a method of coupling a solar cell and an electrically conductive connector, comprising:
providing a first solar cell comprising a wrap-around metal finger that passes between a first edge of the solar cell and a first contact pad of the first solar cell;
positioning an insulating material over the wrap-around metal finger; and
electrically coupling an electrically conductive connector to the first contact pad.

Example C2 includes the subject matter of example C1, or any other example herein, wherein positioning the insulating material comprises applying the insulating material to the electrically conductive connector.

Example C3 includes the subject matter of example C2, or any other example herein, wherein applying the insulating material to the electrically conductive connector comprises painting the insulating material on the electrically conductive connector.

Example C4 includes the subject matter of example C1, or any other example herein, wherein positioning the insulating material comprises applying the insulating material to the solar cell.

Example C5 includes the subject matter of example C4, or any other example herein, wherein applying the insulating material to the solar cell comprises applying an adhesive to the electrically conductive connector.

Example C6 includes the subject matter of example C4, or any other example herein, wherein applying the insulating material to the solar cell comprises applying an insulating tape over the solar cell.

Example C7 includes the subject matter of example 01, or any other example herein, wherein electrically coupling an electrically conductive connector comprises soldering.

Example C8 includes the subject matter of example C7, or any other example herein, wherein soldering comprises laser soldering.

Example C9 includes the subject matter of example C1, or any other example herein, further comprising positioning a solder material between a tab of the electrically conductive connector and the first contact pad.

Example C10 includes the subject matter of example C9, or any other example herein, wherein positioning a solder material between a tab of the electrically conductive connector and the first contact pad comprises applying the solder material to a tab of an interconnect.

Example C11 includes the subject matter of example C9, or any other example herein, wherein positioning a solder material between a tab of the electrically conductive connector and the first contact pad comprises applying the solder material to the solar cell.

Example C12 includes the subject matter of example C9, or any other example herein, wherein positioning a solder material comprises applying one or more of stencil printed solder paste, jet printing solder paste, pre-applying solder as a printed paste, or plating of solder.

Example C13 includes the subject matter of example C9, or any other example herein, wherein the electrically conductive connector comprises an interconnect or a busbar.

Example D1 is a method of coupling two solar cells, comprising:
    providing a first solar cell comprising a wrap-around metal contact finger that passes between a first edge of the first solar cell and at least one first contact pad of the first solar cell, wherein the first contact pad is of opposite polarity to the wrap-around metal contact finger;
    providing a second solar cell comprising at least one second contact pad of opposite polarity to the first contact pad of the first solar cell;
    positioning an insulating material over the wrap-around metal contact finger;
    electrically coupling an interconnect to the at least one first contact pad on the first solar cell; and
    electrically coupling the interconnect to the at least one second contact pad on the second solar cell.

Example D2 includes the subject matter of example D1, or any other example herein, wherein positioning the insulating material comprises applying the insulating material to the interconnect.

Example D3 includes the subject matter of example D1, or any other example herein, wherein applying the insulating material to the interconnect comprises painting the insulating material on the interconnect.

Example D4 includes the subject matter of example D3, or any other example herein, wherein positioning the insulating material comprises applying the insulating material to the solar cell.

Example D5 includes the subject matter of example D4, or any other example herein, wherein positioning the insulating material comprises applying the insulating material to an entire back side of the solar cell.

Example D6 includes the subject matter of example D1, or any other example herein, wherein positioning an insulating material over the wrap-around positive metal contact finger comprises positioning an adhesive over the wrap-around metal contact finger.

Example D7 includes the subject matter of example D1, or any other example herein, wherein positioning an insulating material over the wrap-around positive metal contact finger comprises positioning an insulating tape over the wrap-around metal contact finger.

Example D8 includes the subject matter of example D1, or any other example herein, wherein electrically coupling an electrically conductive connector comprises soldering.

Example D9 includes the subject matter of example D8, or any other example herein, wherein soldering comprises laser soldering.

Example D10 includes the subject matter of example D1, or any other example herein, further comprising positioning a solder material between a contact tab of the electrically conductive connector and the at least one first contact pad.

Example D11 includes the subject matter of example D10, or any other example herein, wherein positioning the solder material comprises applying the solder material to the interconnect tab.

Example D12 includes the subject matter of example D10, or any other example herein, wherein positioning the solder material comprises applying the solder material to the solar cell.

Example D13 includes the subject matter of example D10, or any other example herein, wherein positioning the solder material comprises one or more of stencil printing solder paste, jet printing solder paste, or plating of solder.

Example D14 includes the subject matter of example D10, or any other example herein, further comprising electrically coupling a busbar to at least one third contact pad.

Example D15 includes the subject matter of example D1, or any other example herein, wherein the wrap-around metal contact finger comprises a p-metal wrap-around contact finger.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims can be formulated during prosecution of this application (or an application claiming priority thereto) to any such combination of features. In particular, with reference to the appended claims, features from dependent claims can be combined with those of the independent claims and features from respective independent claims can be combined in any appropriate manner and not merely in the specific combinations enumerated in the appended claims.

What is claimed is:

1. A solar cell comprising:
    a first plurality of metal contact fingers, each of the first plurality of metal contact fingers coupled to one or more first diffusion regions on the backside of the solar cell;
    a contact pad on a first edge of the solar cell, the contact pad electrically coupled to the first plurality of metal contact fingers, wherein a first portion of the first plurality of metal contact fingers is connected to a first side of the contact pad where an entirety of each metal contact finger of the first portion of the first plurality of metal contact fingers extends from the contact pad along only a first single linear direction from the contact pad to a terminal end of each metal contact finger of the first portion of the first plurality of metal contact fingers, a second portion of the first plurality of metal contact fingers is connected to a second side of the contact pad where an entirety of each metal contact finger of the second portion of the first plurality of metal contact fingers extends from the contact pad along only a second single linear direction from the contact pad to a terminal end of each metal contact finger of the second portion of the first plurality of metal contact fingers, the second single linear direction opposite the first single linear direction, the second side opposite the first side, and the first portion of the first plurality of metal contact fingers is facing away from the second portion of the first plurality of metal contact fingers, wherein a third portion of the first plurality of metal contact fingers is connected to a third side of the contact pad orthogonal to the first side and second side of the contact pad, wherein an entirety of each metal contact finger of the third portion of the first plurality of metal contact fingers is along only a third linear direction, the third linear direction orthogonal to the first linear direction and to the second linear direction, and wherein the third portion of the first plurality of metal contact fingers extends laterally beyond the contact pad along the third linear direction from the first side of the contact pad to the second side of the contact pad; and a second plurality of metal contact fingers, wherein a first portion of the second plurality of metal contact fingers is interdigitated with the first portion of the first plurality of metal contact fingers, a second portion of the second plurality of metal contact fingers is interdigitated with the second portion of the first plurality of metal contact fingers, and a third portion of the second plurality of metal contact fingers is interdigitated with the third portion of the first plurality of metal contact fingers, the third portion of the second plurality of metal contact fingers orthogonal to the first and second portions of the second plurality of metal contact fingers, each of the second plurality of metal contact fingers being coupled to one or more second diffusion regions on the backside of the solar cell, wherein the second plurality of metal contact fingers comprises a wrap-around metal finger that is positioned between the contact pad and a portion of the first edge of the solar cell that is closest to the contact pad.

2. The solar cell of claim 1, further comprising:
an electrically conductive connector soldered to the contact pad; and
an insulating material positioned between the electrically conductive connector and the wrap-around metal finger and configured to prevent a short between the electrically conductive connector and the wrap-around metal finger.

3. The solar cell of claim 2, wherein the electrically conductive connector comprises an interconnect or a busbar.

4. The solar cell of claim 2, wherein the electrically conductive connector further comprises a laser solder artifact.

5. The solar cell of claim 1, wherein the first plurality of metal contact fingers are a first plurality of p-metal contact fingers.

6. The solar cell of claim 1, wherein the distance between the wrap-around metal finger and the portion of the first edge is within a range of approximately 0.2 mm to 1.2 mm.

7. The solar cell of claim 2, wherein the insulating material comprises an insulating tape.

8. The solar cell of claim 1, wherein an edge of the contact pad closest to the first edge of the solar cell is further from the edge of the solar cell than an edge-most of the first plurality of metal contact fingers.

9. The solar cell according to claim 1, wherein the contact pad has a width in a direction parallel to the first edge, and the wrap-around metal finger is positioned between the contact pad and the first edge for the entire width of the contact pad.

10. The solar cell of claim 1, further comprising:
an electrically conductive connector soldered to the contact pad.

11. The solar cell of claim 10, wherein the electrically conductive connector comprises an interconnect.

12. The solar cell of claim 10, wherein the electrically conductive connector comprises a busbar.

13. The solar cell of claim 10, wherein the electrically conductive connector further comprises a laser solder artifact.

* * * * *